(12) United States Patent
Goorden et al.

(10) Patent No.: US 12,585,198 B2
(45) Date of Patent: Mar. 24, 2026

(54) LITHOGRAPHIC APPARATUS, MULTI-WAVELENGTH PHASE-MODULATED SCANNING METROLOGY SYSTEM AND METHOD

(71) Applicants: ASML Netherlands B.V., Veldhoven (NL); ASML Holding N.V., Veldhoven (NL)

(72) Inventors: Sebastianus Adrianus Goorden, Eindhoven (NL); Filippo Alpeggiani, Eindhoven (NL); Simon Reinald Huisman, Eindhoven (NL); Johannes Jacobus Matheus Baselmans, Oirschot (NL); Haico Victor Kok, Veldhoven (NL); Mohamed Swillam, Wilton, CT (US); Arjan Johannes Anton Beukman, Son en Breugel (NL)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 291 days.

(21) Appl. No.: 18/000,087

(22) PCT Filed: May 14, 2021

(86) PCT No.: PCT/EP2021/062894
§ 371 (c)(1),
(2) Date: Nov. 28, 2022

(87) PCT Pub. No.: WO2021/239479
PCT Pub. Date: Dec. 2, 2021

(65) Prior Publication Data
US 2023/0213871 A1     Jul. 6, 2023

Related U.S. Application Data

(60) Provisional application No. 63/093,351, filed on Oct. 19, 2020, provisional application No. 63/029,984, filed on May 26, 2020.

(51) Int. Cl.
*G03F 7/00* (2006.01)
*G03F 9/00* (2006.01)

(52) U.S. Cl.
CPC ...... *G03F 7/70625* (2013.01); *G03F 7/70633* (2013.01); *G03F 7/706849* (2023.05); *G03F 7/706851* (2023.05); *G03F 9/7049* (2013.01)

(58) Field of Classification Search
CPC .............. G03F 7/70625; G03F 9/7049; G03F 7/70633; G03F 7/70605–706851;
(Continued)

(56) References Cited

U.S. PATENT DOCUMENTS

RE34,010 E * 7/1992 Magome .............. G03F 9/7049
356/488
6,297,876 B1 10/2001 Bornebroek
(Continued)

FOREIGN PATENT DOCUMENTS

EP      3 410 212 A1   12/2018
EP      3 454 125 A1   3/2019
(Continued)

OTHER PUBLICATIONS

International Search Report and Written Opinion of the International Searching Authority directed to International Patent Application No. PCT/EP2021/062894, mailed Aug. 26, 2021; 10 pages.
(Continued)

*Primary Examiner* — Christina A Riddle
(74) *Attorney, Agent, or Firm* — Pillsbury Winthrop Shaw Pittman, LLP

(57) ABSTRACT

A metrology system includes a radiation source, first, second, and third optical systems, and a processor. The first optical system splits the radiation into first and second beams of radiation and impart one or more phase differences between the first and second beams. The second optical
(Continued)

system directs the first and second beams toward a target structure to produce first and second scattered beams of radiation. The third optical system interferes the first and second scattered beams at an imaging detector. The imaging detector generates a detection signal based on the interfered first and second scattered beams. The metrology system modulates one or more phase differences of the first and second scattered beams based on the imparted one or more phase differences. The processor analyzes the detection signal to determine a property of the target structure based on at least the modulated one or more phase differences.

18 Claims, 15 Drawing Sheets

(58) Field of Classification Search
CPC ....... G03F 7/70; G03F 7/70483–70541; G01B 11/272
USPC ...... 355/18, 30, 52–55, 67–77; 356/399–401
See application file for complete search history.

(56) References Cited

U.S. PATENT DOCUMENTS

| | | |
|---|---|---|
| 6,961,116 B2 | 11/2005 | Den Boef et al. |
| 7,511,799 B2 | 3/2009 | Tel et al. |
| 8,706,442 B2 | 4/2014 | Mos et al. |

| | | | | |
|---|---|---|---|---|
| 2003/0030819 | A1 | 2/2003 | Kuechel | |
| 2004/0033426 | A1 | 2/2004 | Den Boef et al. | |
| 2004/0042014 | A1 | 3/2004 | Feldman | |
| 2005/0275848 | A1* | 12/2005 | Hill .................... | G01B 9/02002 |
| | | | | 356/512 |
| 2009/0195768 | A1 | 8/2009 | Bijnen et al. | |
| 2016/0011523 | A1* | 1/2016 | Singh ................. | G01N 21/4788 |
| | | | | 355/77 |
| 2018/0348645 | A1* | 12/2018 | Ravensbergen .... | G03F 7/70625 |
| 2019/0086201 | A1* | 3/2019 | Den Boef .............. | G03F 7/705 |
| 2019/0113852 | A1* | 4/2019 | Ravensbergen .... | G03F 7/70625 |

FOREIGN PATENT DOCUMENTS

| | | | |
|---|---|---|---|
| EP | 3 470 926 A1 | 4/2019 | |
| WO | WO 2020/057900 | 3/2020 | |

OTHER PUBLICATIONS

International Preliminary Report on Patentability directed to International Patent Application No. PCT/EP2021/062894, issued Nov. 17, 2022; 7 pages.

Raymond et al., "Multiparameter grating metrology using optical scatterometry," Journal of Vacuum Science & Technology B: Microelectronics and Nanometer Structures Processing, Measurement, and Phenomena, vol. 15, No. 2, Jun. 4, 1998; pp. 361-368.

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

* cited by examiner

518

503

651

652

652

652

652

1128

1154

1152

LITHOGRAPHIC APPARATUS, MULTI-WAVELENGTH PHASE-MODULATED SCANNING METROLOGY SYSTEM AND METHOD

CROSS-REFERENCE TO RELATED APPLICATIONS

This application claims priority of U.S. Provisional Patent Application No. 63/029,984, which was filed on May 26, 2020, and U.S. Provisional Patent Application No. 63/093, 351, which was filed on Oct. 19, 2020, both of which are incorporated herein in their entirety by reference.

FIELD

The present disclosure relates to a metrology system, for example, an alignment apparatus for measuring a position of a feature on a substrate in lithographic systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Errors in alignment of wafers in a lithographic apparatus result in reduced quality, unreliable performance, and reduced yield rates of fabricated devices, which in turn increases time and cost of fabrication of devices.

SUMMARY

Accordingly, it is desirable to improve metrology techniques that allow for more accurate placement of lithographed structures on wafers.

In some embodiments, a metrology system comprises a radiation source, first, second, and third optical systems, and a processor. The first optical system is configured to split the radiation into first and second beams of radiation and impart one or more phase differences between the first and second beams. The second optical system is configured to direct the first and second beams toward a target structure to produce first and second scattered beams of radiation. The third optical system is configured to interfere the first and second scattered beams at an imaging detector. The imaging detector is configured to generate a detection signal based on the interfered first and second scattered beams. The metrology system is configured to modulate one or more phase differences of the first and second scattered beams based on the imparted one or more phase differences. The processor is configured to analyze the detection signal to determine a property of the target structure based on at least the modulated one or more phase differences.

In some embodiments, a lithographic apparatus system comprises an illumination system, a projection system, and a metrology system. The metrology system comprises a radiation source, first, second, and third optical systems, and a processor. The illumination system is configured to illuminate a pattern of a patterning device. The projection system is configured to project an image of the pattern onto a substrate. The first optical system is configured to split the radiation into first and second beams of radiation and impart one or more phase differences between the first and second beams. The second optical system is configured to direct the first and second beams toward a target structure to produce first and second scattered beams of radiation. The third optical system is configured to interfere the first and second scattered beams at an imaging detector. The imaging detector is configured to generate a detection signal based on the interfered first and second scattered beams. The metrology system is configured to modulate one or more phase differences of the first and second scattered beams based on the imparted one or more phase differences. The processor is configured to analyze the detection signal to determine a property of the target structure based on at least the modulated one or more phase differences.

In some embodiments, a method comprises generating radiation. The method further comprises splitting the radiation into first and second beams of radiation using a first optical system. The method further comprises imparting one or more phase differences between the first and second beams using the first optical system. The method further comprises directing the first and second beams toward a target to produce first and second scattered beams of radiation. The method further comprises interfering the first and second scattered beams at an imaging detector. The method further comprises modulating one or more phase differences of the first and second scattered beams. The method further comprises generating a detection signal using the imaging detector. The method further comprises analyzing the detection signal to determine a property of the target structure base on at least the modulated one or more phase differences.

Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

4

Figure 13:
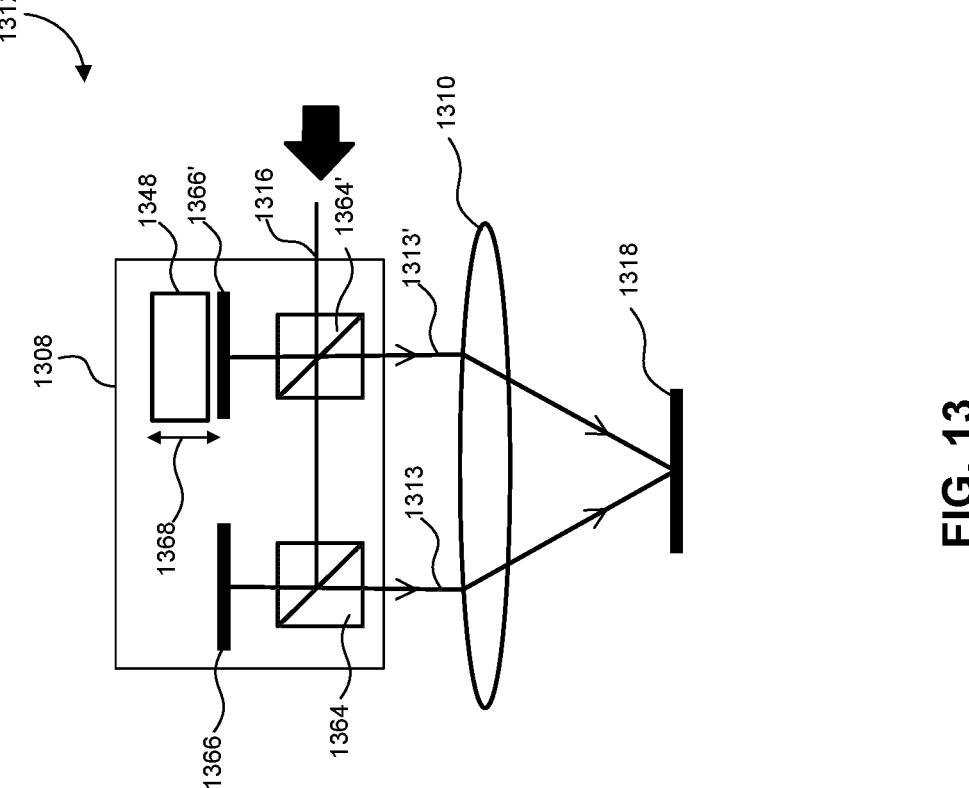
Figure 14:
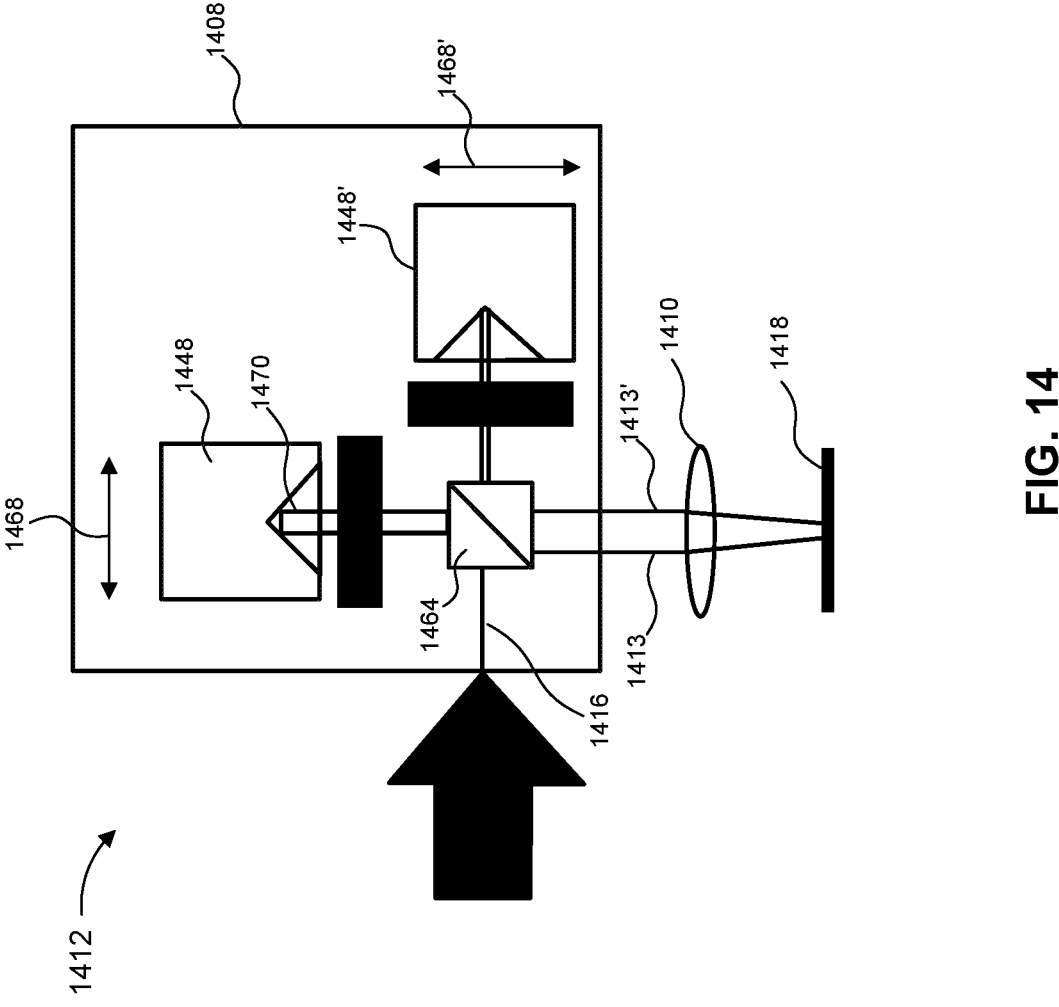
Figure 15:
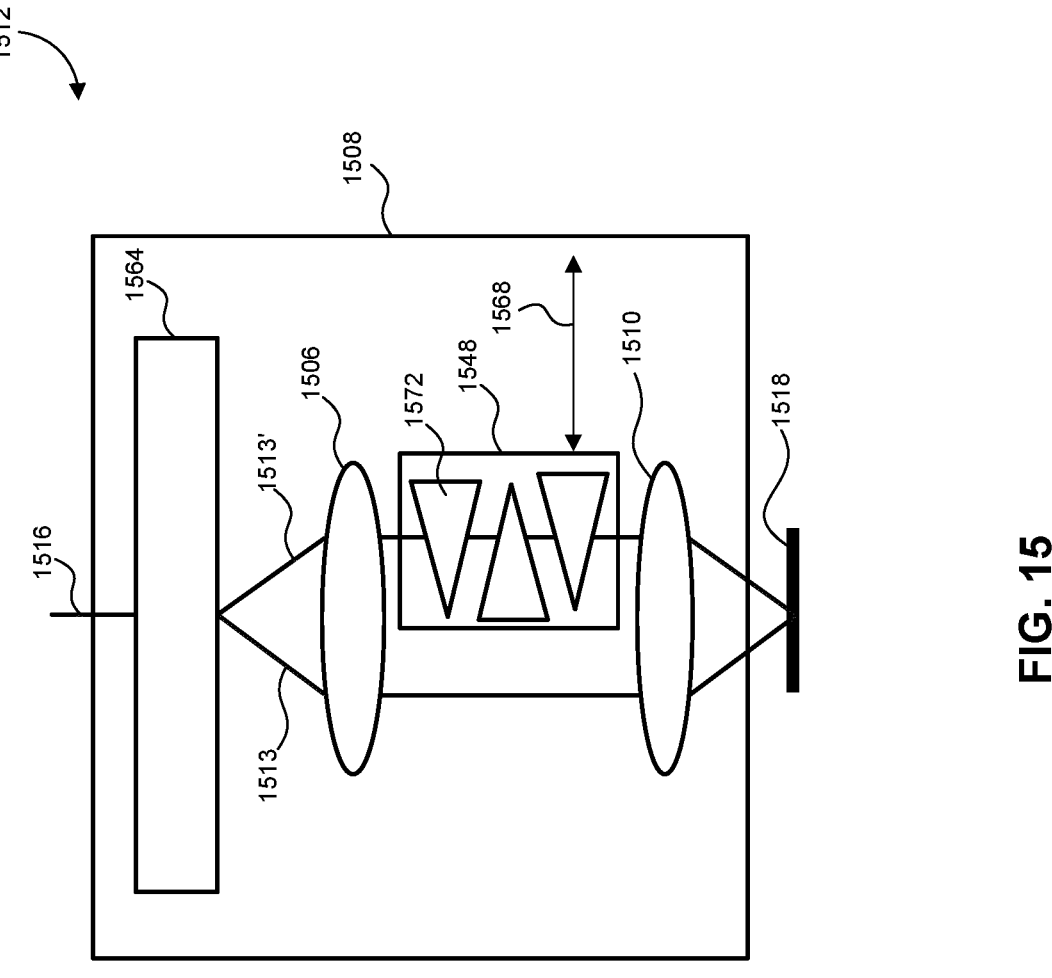

FIGS. 13-15 show phase modulation portions of an illumination system 1312, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1A:
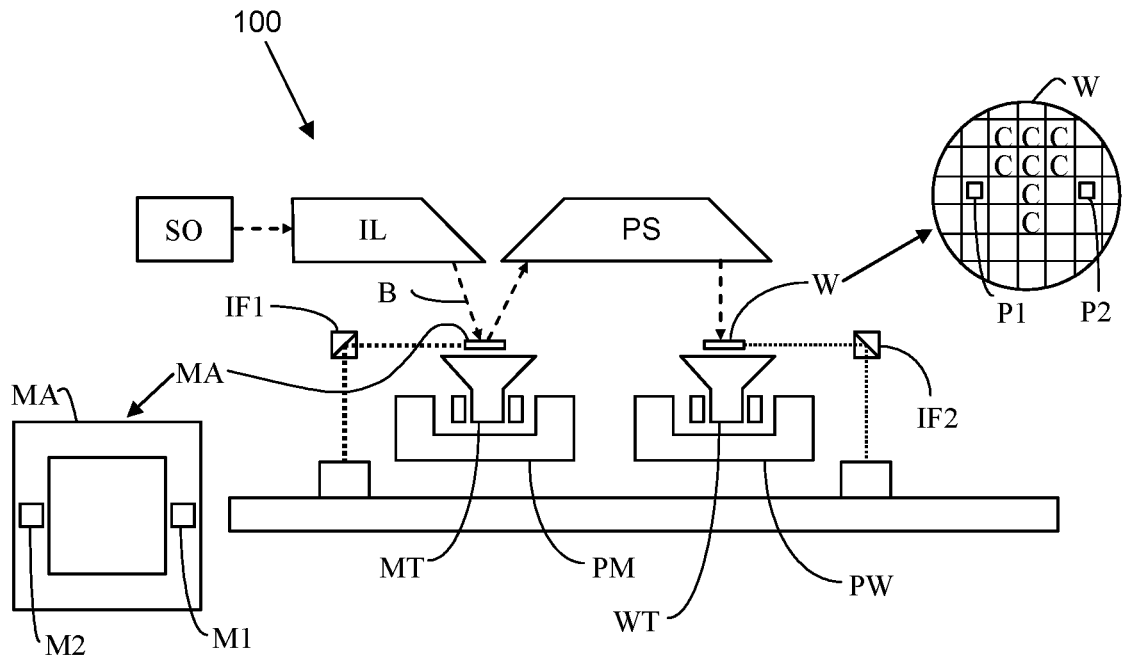
FIG. 1A shows a schematic of a reflective lithographic apparatus, according to some embodiments.
Figure 1B:
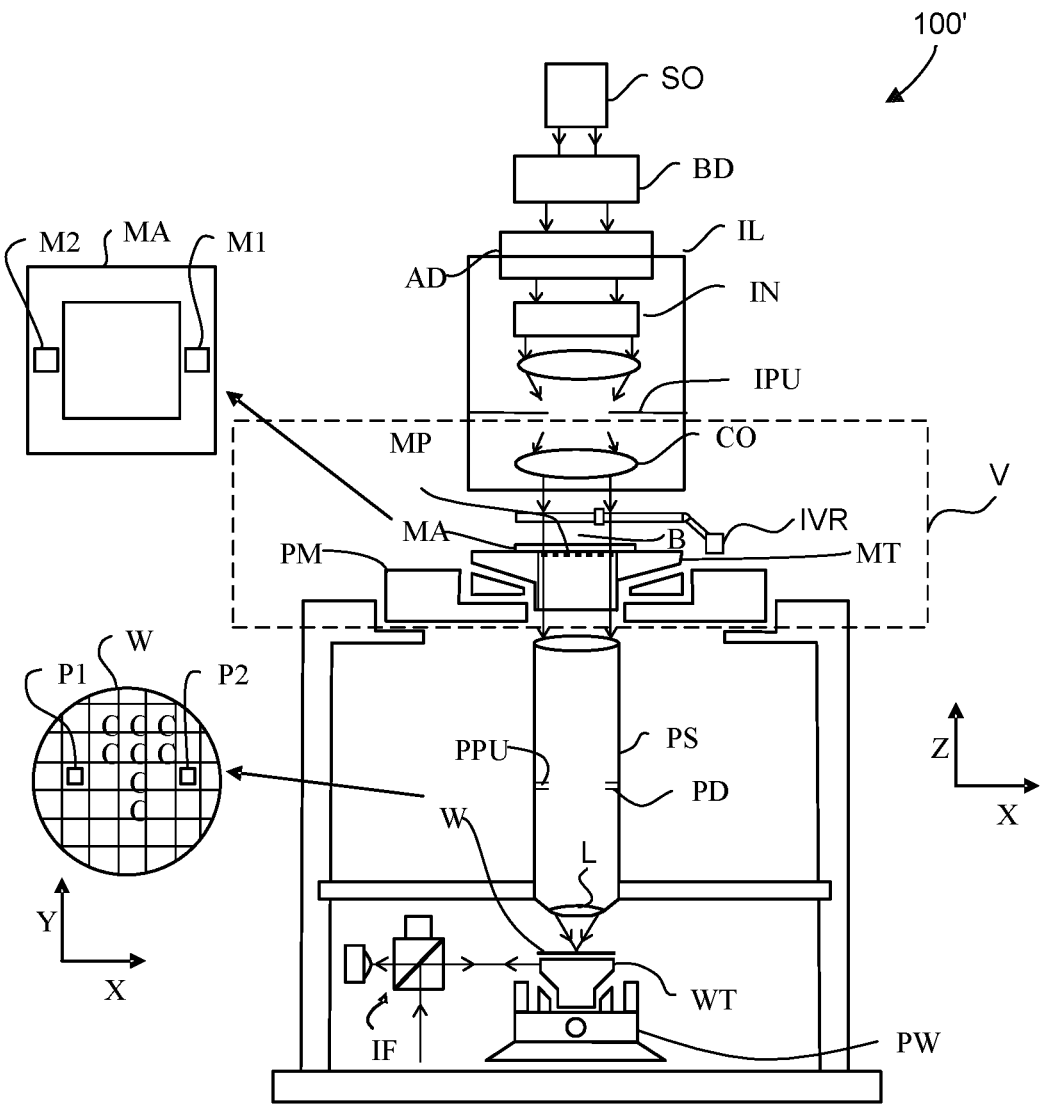
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The terms "inspection apparatus." "metrology apparatus." and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner." respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image of the mask pattern MP, where the image is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
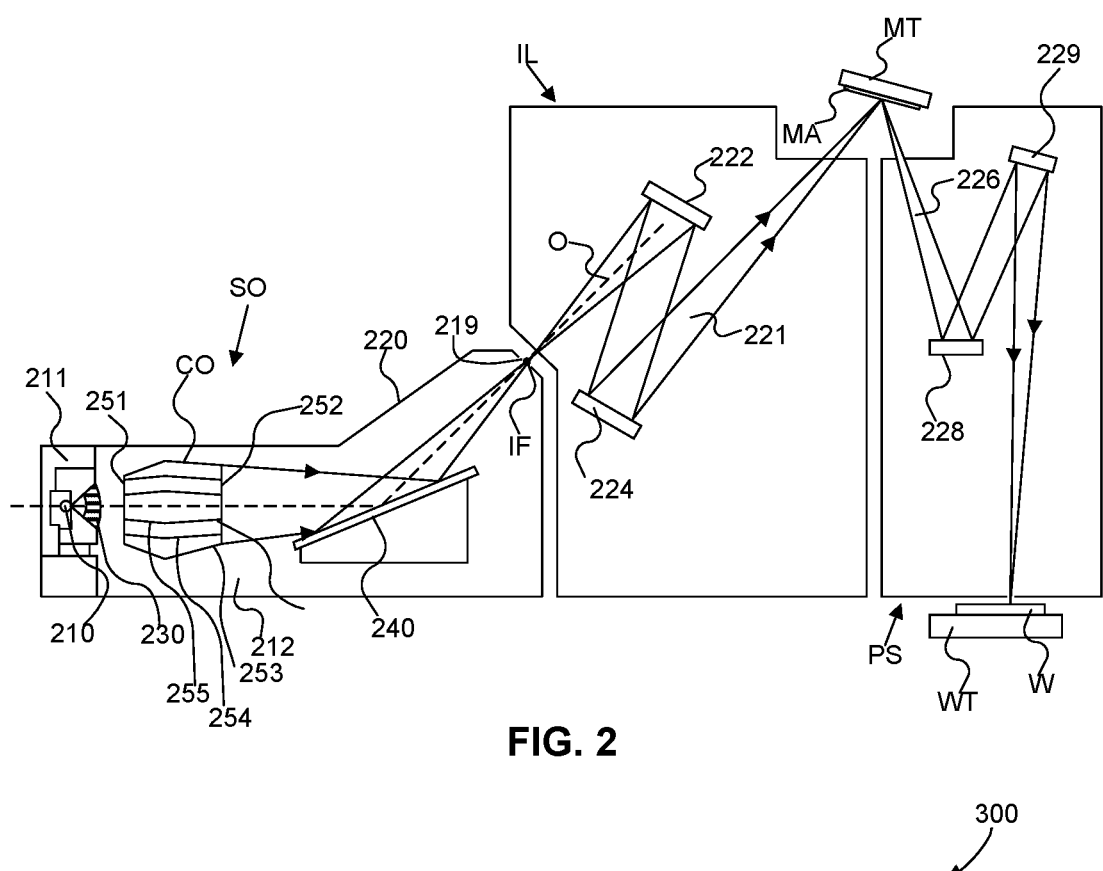
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
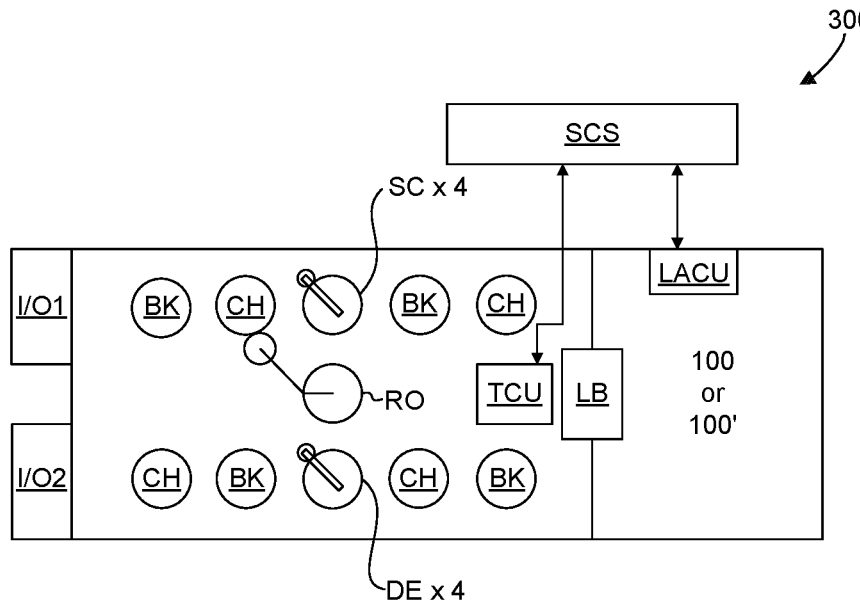
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Inspection Apparatus

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
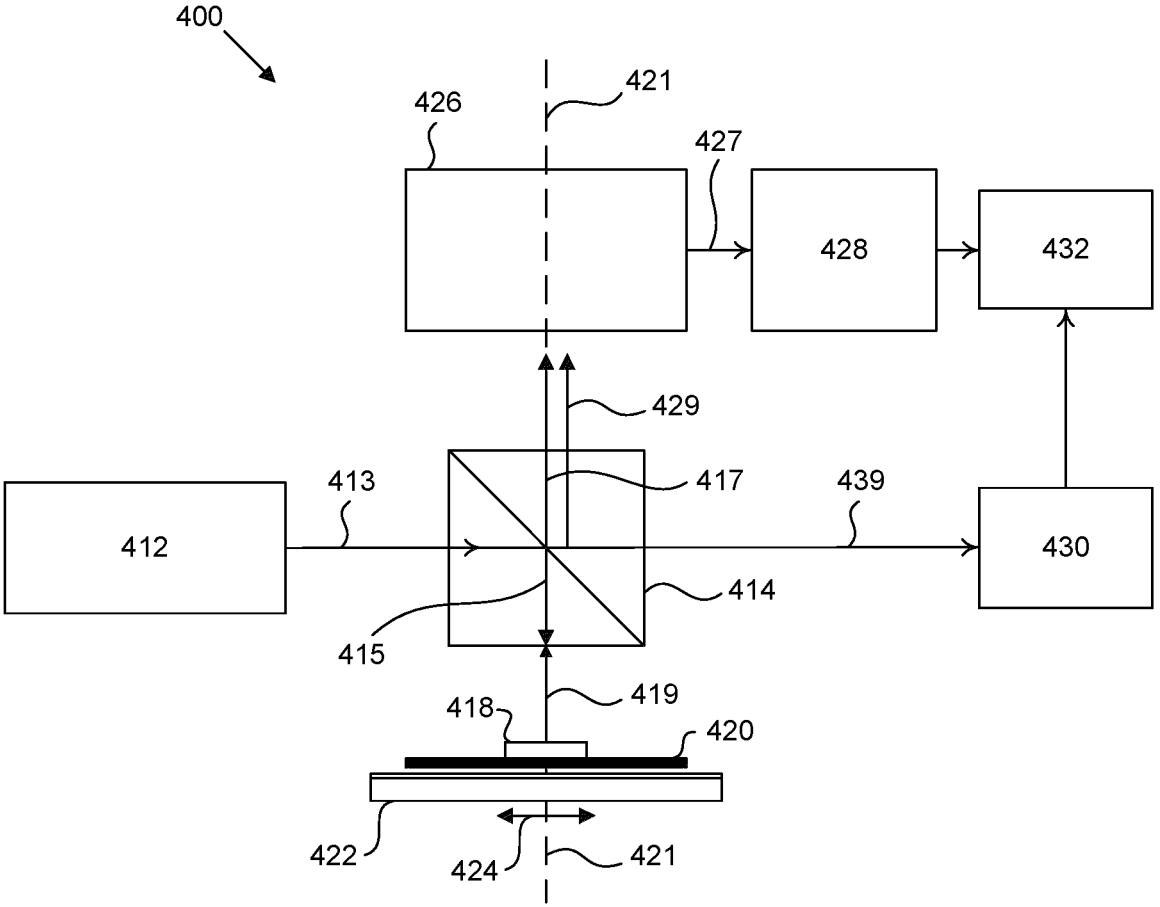
FIGS. 4A and 4B show schematics of inspection apparatuses, according to some embodiments.

FIG. 4A shows a schematic of a cross-sectional view of an inspection apparatus 400 that can be implemented as a part of lithographic apparatus 100 or 100', according to some embodiments. In some embodiments, inspection apparatus 400 can be configured to align a substrate (e.g., substrate W) with respect to a patterning device (e.g., patterning device MA). Inspection apparatus 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, inspection apparatus 400 can include an illumination system 412, a beam splitter 414, an interferometer 426, a detector 428, a beam analyzer 430, and an overlay calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., inspection apparatus 400) compared to the current alignment apparatuses.

In some embodiments, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, beam splitter 414 can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and unrotated images interferometrically.

In some embodiments, detector 428 can be configured to receive the recombined image via interferometer signal 427 and detect interference as a result of the recombined image when alignment axis 421 of inspection apparatus 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can be obtained, for example, with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of inspection apparatus 400 or any other reference element such that the center of symmetry of alignment mark or target 418 can be known with reference to inspection apparatus 400 or any other reference element. Beam analyzer 430 can be a point or an imaging polarimeter with some form of wavelength-band selectivity. In some embodiments, beam analyzer 430 can be directly integrated into inspection apparatus 400, or connected via fiber optics of several types: polarization preserving single mode, multimode, or imaging, according to other embodiments.

In some embodiments, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
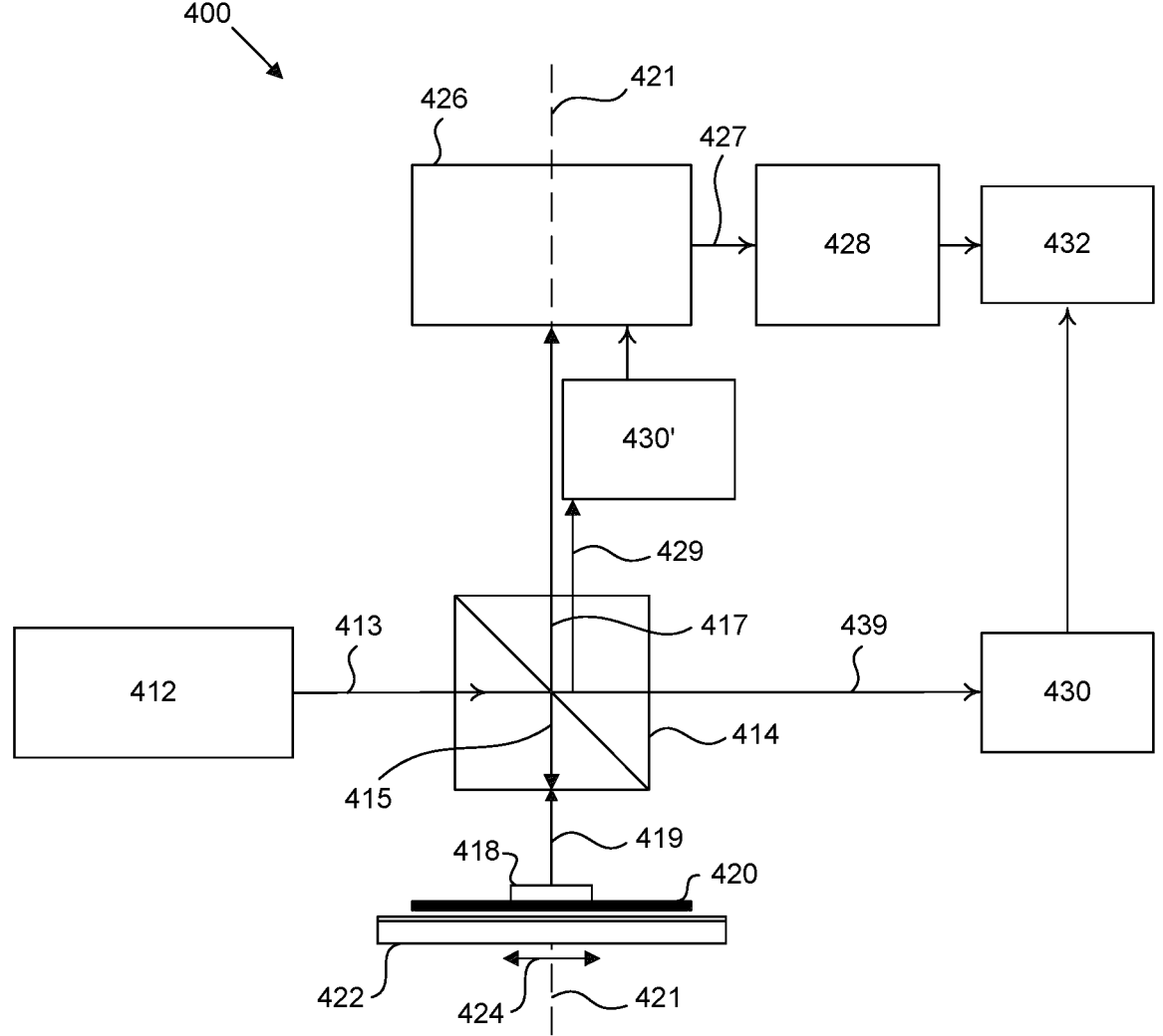

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of inspection apparatus 400, or any other reference element, such that the center of symmetry of alignment mark or target 418 can be known with reference to inspection apparatus 400, or any other reference element. Second beam analyzer 430' can be further configured to determine the overlay data between two patterns and a model of the product stack profile of substrate 420. Second beam analyzer 430' can also be configured to measure overlay, critical dimension, and focus of target 418 in a single measurement.

In some embodiments, second beam analyzer 430' can be directly integrated into inspection apparatus 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an overlay calculation processor. The information can comprise a model of the product stack profile constructed by beam analyzer 430. Alternatively, processor 432 can construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the inspection apparatus 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. Consequently the process must have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 can group marks into sets of similar overlay error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the overlay, for example, by feeding corrections into the inspection apparatus 400.

Figure 5:
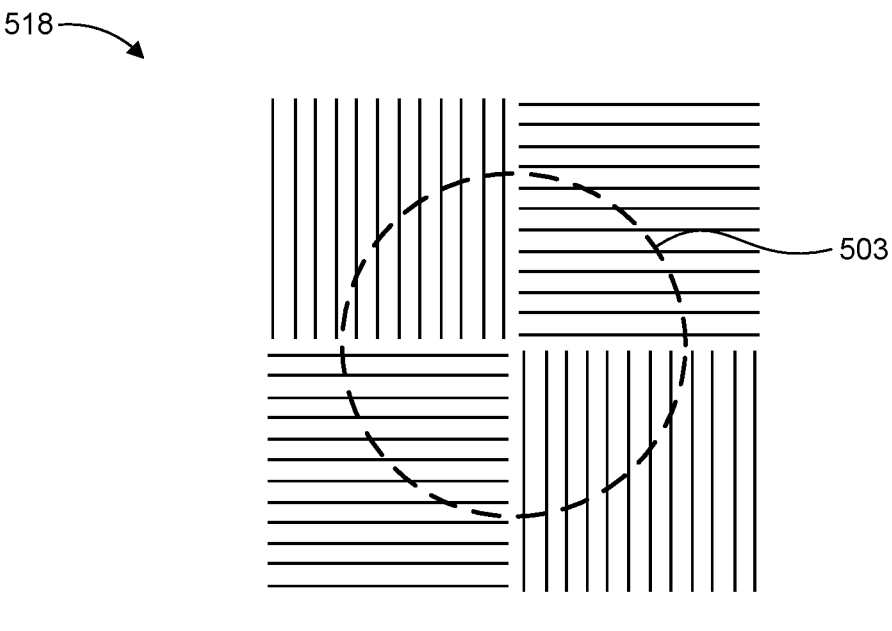
FIG. 5 shows a structure of a target, according to some embodiments.

FIG. 5 shows a structure of a target 518, according to some embodiments. In some embodiments, target 518 comprises grating structures arranged in four quadrants. Each quadrant's grating structure is perpendicular to the grating structure of adjacent quadrants. A circle 503 indicates the size of an illumination spot relative to an area of target 518. The area of the illumination spot is smaller than the area of target 518 (e.g., underfilled). In some embodiments, the area of the illumination spot is larger than the area of target 518 (e.g., overfilled, not shown). The structure shown for target 518 can be used in, for example, targets 418 (FIGS. 4A, 4B), 718 (FIG. 7), and 818 (FIG. 8).

Figure 6:
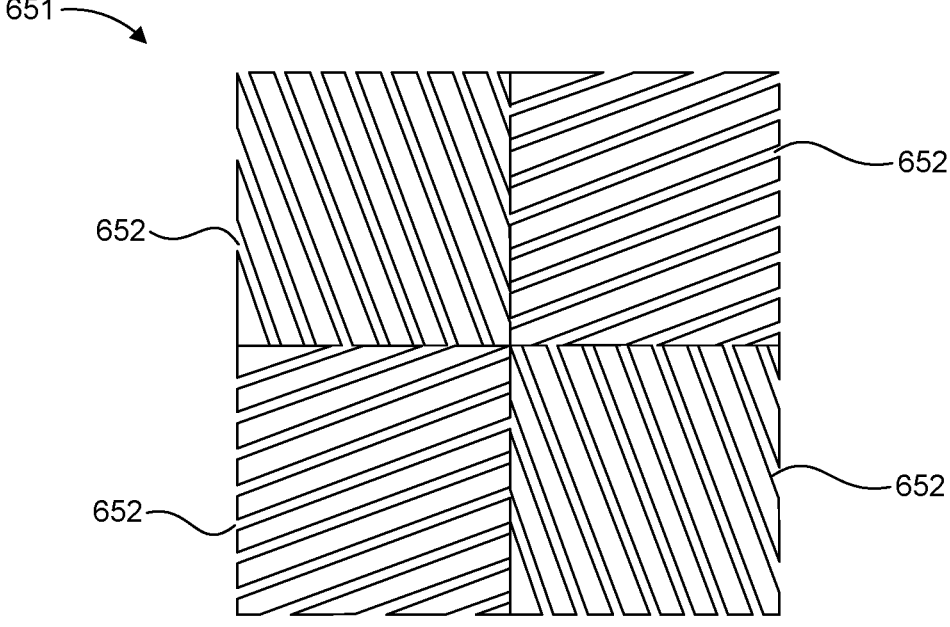
FIG. 6 shows a detected image, according to some embodiments.

FIG. 6 shows a detected image 651, according to some embodiments. In some embodiments, a detected image using a metrology system can comprise a one or more Moiré fringe patterns 652, particularly if the metrology system is one that performs image detection on, for example, target 518 (FIG. 5).

In some embodiments, inspection apparatuses and systems described herein can perform measurements at various locations on a target using discrete steps or using a continuous scan (or a mix of both). Embodiments described herein disclose structures and functions for improving accuracy of inspection using scanning operations and modulation of a phase of radiation.

Figure 7:
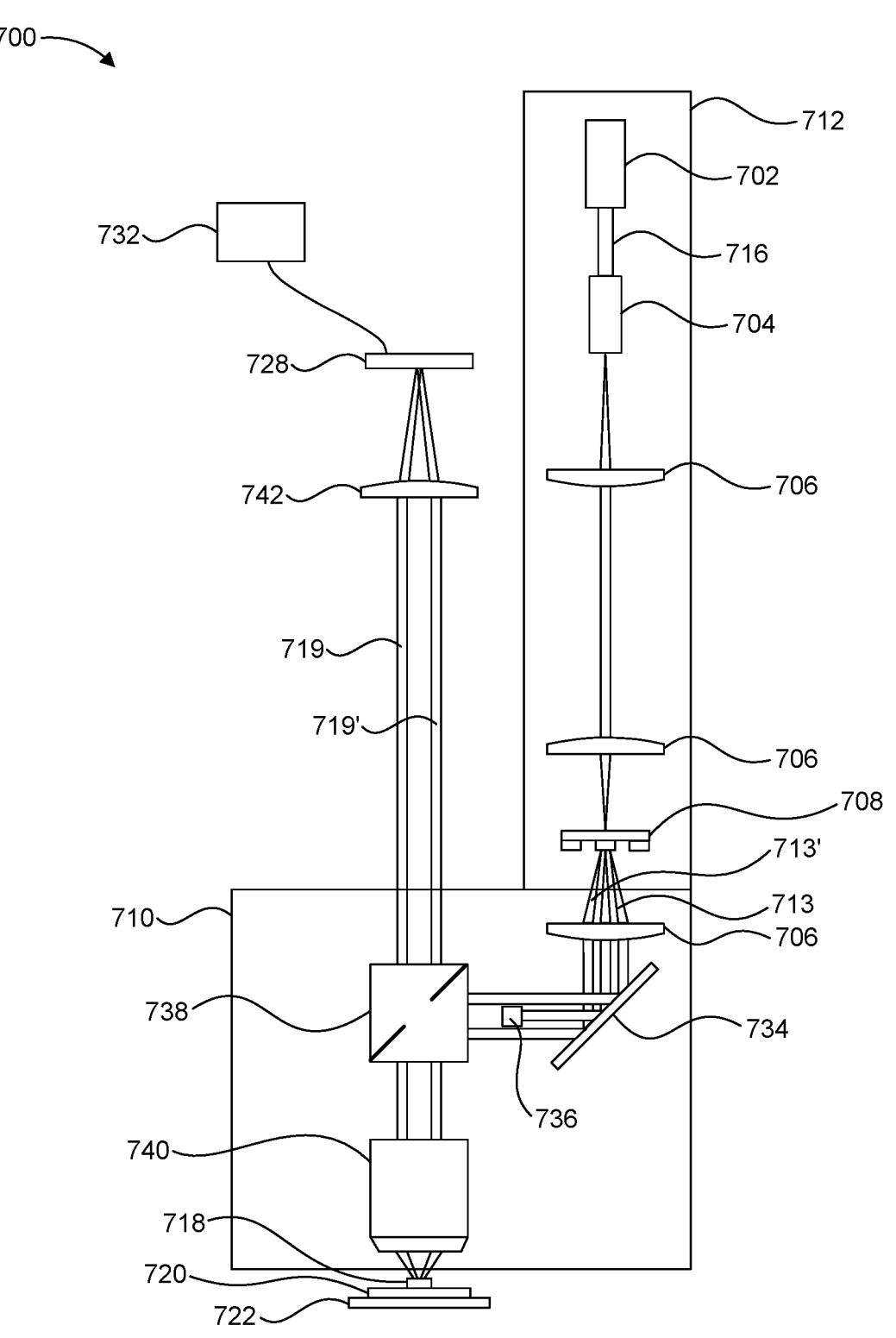
FIGS. 7, 8 and 9 show metrology systems, according to some embodiments.
Figure 8:
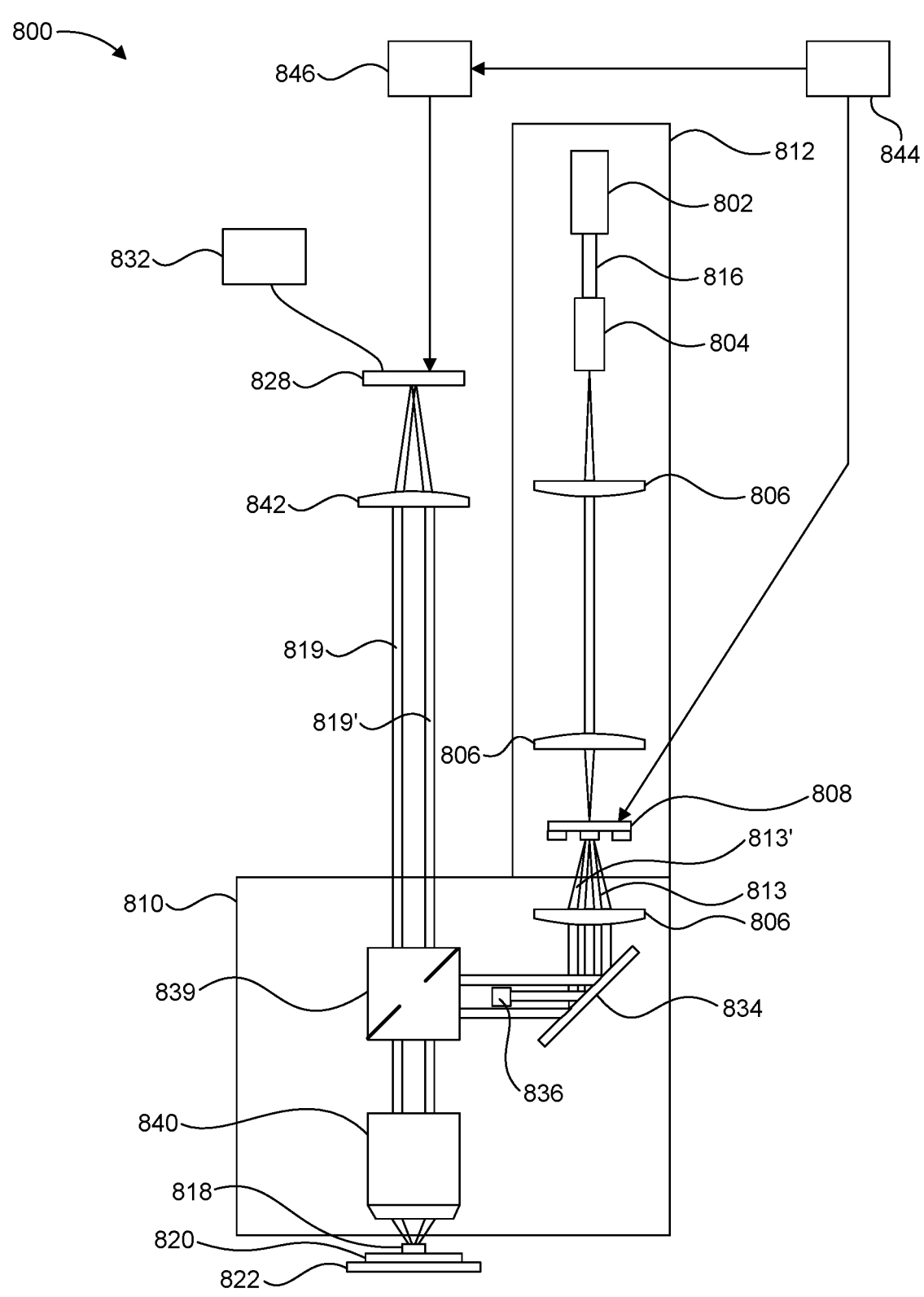

FIG. 7 shows a metrology system 700, according to some embodiments. In some embodiments, metrology system 700 can also represent a more detailed view of inspection apparatus 400 (FIGS. 4A and 4B). For example, FIG. 7 illustrates a more detailed view of illumination system 412 and its functions. Unless otherwise noted, elements of FIG. 7 that have similar reference numbers (e.g., reference numbers sharing the two right-most numeric digits) as elements of FIGS. 4A and 4B can have similar structures and functions.

In some embodiments, metrology system 700 comprises an illumination system 712, an optical system 710, a detector 728, and a processor 732. Illumination system 712 can comprise a radiation source 702, an optical fiber 704 (e.g., a multi-mode fiber), an optical element(s) 706 (e.g., a lens or lens system), and a diffractive element 708 (e.g., a grating, adjustable grating, and the like). Optical system 710 can comprise one or more of optical element 706, a blocking element 736, a reflective element 738 (e.g., spot mirror), and an optical element 740 (e.g., an objective lens). FIG. 7 shows a non-limiting depiction of metrology system 700 inspecting a target 718 (also "target structure") on a substrate 720. The substrate 720 is disposed on a stage 722 that is adjustable (e.g., a support structure that can move). It should be appreciated the structures drawn within illumination system 712 and optical system 710 are not limited to their depicted positions. For example, diffractive element 708 can be within optical system 710. The positions of structures can vary as necessary, for example, as designed for a modular assembly.

In some embodiments, radiation source 702 can generate radiation 716. Radiation 716 can be spatially incoherent. Since the output of radiation source 702 may not be pointed directly toward downstream optical structures, optical fiber 704 can guide radiation 716 to downstream optical structures. Optical element(s) 706 can direct or condition radiation 716 (e.g., focus, collimate, make parallel, and the like). Diffractive element 708 can diffract radiation 716 to generate beams of radiation 713 and 713' (also first and second beams of radiation). Beam of radiation 713 can comprise a first non-zero diffraction order from diffractive element 708 (e.g., +1 order). Beam of radiation 713' can comprise a second non-zero diffraction order from diffractive element 708 (e.g., −1 order) that is different from the first non-zero diffraction order. Diffractive element 708 can also generate a zeroth order beam (not labeled). Blocking element 736 can block the zeroth order beam to allow darkfield measurements. Spot mirror directs beams of radiation 713 and 713' toward target 718. Optical element 740 focuses beams of radiation 713 and 713' onto target 718 such that illumination spots of both beams overlap. The illumination spots can underfill or overfill target 718.

In some embodiments, target 718 can comprise a diffractive structure (e.g., a grating(s) as shown in FIG. 5). Target 718 can reflect, refract, diffract, scatter, or the like, radiation. For ease of discussion, and without limitation, radiation that interacts with a target will be termed scattered radiation throughout. Target 718 can scatter incident radiation, which is represented by scattered beams of radiation 719 and 719' (also first and second scattered beams of radiation). Scattered beam of radiation 719 can represent radiation from beam of radiation 713 that has been scattered by target 718. Similarly, scattered beam of radiation 719' can represent radiation from beam of radiation 713' that has been scattered by target 718. Optical element 742 focuses scattered beams of radiation 719 and 719' such that scattered beams of radiation 719 and 719' interfere at detector 728. Optical element 740 directs beams of radiation 713 and 713' such that they are incident on target 718 at non-zero incidence angles (e.g., off-axis). The term "off-axis" and "wide-angle" may be used herein to refer to a propagation direction that is oblique with respect to a surface, particularly with respect to a plane of a target. The image at the detector 728 can be an interference pattern (e.g., a Moiré fringe pattern as shown in FIG. 6). Detector 728 can generate a detection signal based on having received scattered beams of radiation 719 and 719'. Detector 728 can be an imaging detector (e.g., CCD, CMOS, or the like). In this scenario, the detection signal can comprise a digital or analog representation of an image comprising the interference pattern, which are sent to processor 732.

In some embodiments, processor 732 can analyze the detection signal to determine a property of target 718. It should be appreciated that the measurement process can be different depending on the specific property of target 718 being determined. For example, in the case where the property of target 718 being determined is an alignment position, a measurement is performed on target 718 alone. In another example, in the case where the property of target 718 being determined is an overlay error, the measurement compares target 718 to a second target. Overlay error determination is a process that compares a first target (on a first layer of fabrication) to a second target (on a second layer of fabrication that is different from the first layer) and determines whether the first and second layers are properly overlayed on top of each other. The first and second targets can be, for example, stacked on top of each other or fabricated side-by-side. Determination of other properties of target 718, from either target 718 alone or in conjunction with another target, can be envisaged (e.g., line width, pitch, critical dimension, and the like). Moreover, while beams of radiation 713 and 713' are described above as both being incident on target 718 (i.e., alignment measurement), embodiments can be envisaged where a beam of radiation is directed to another target to allow, for example, overlay error measurements. For example, beams of radiation 713 and/or 713' can be replicated (e.g., using a beam splitter) for sending to another target.

In some embodiments, analysis performed by processor 732 can be based on target 718 having been irradiated by beams of radiation 713 and 713' (e.g., alignment measurement), which have different diffraction orders (e.g., +1 and −1). The analysis comprises, for example, performing a mathematical fit to the Moiré pattern (e.g., fitting a sine function along the direction of the pitch of the Moiré pattern). Using the information inferred from the mathematical fit, the determined property of target 718 can be improved and made more accurate. This technique reduces the impact of factors that reduce accuracy of measurements, for example, finite size effects, presence of higher diffraction orders, imperfections in gratings and optics, and the like. It should be appreciated that the mathematical fit is performed on a still image. For example, regions of interest may be selected on target 718 and/or detected pixels may be assigned weighting to enhance accuracy and robustness of measurement. This is described in more detail in PCT/EP2019/072762, filed on Aug. 27, 2019, which is incorporated by reference herein in its entirety.

In some embodiments, wavefront timings (e.g., phases) of beams of radiation 719 and 719' can be exploited to enhance accuracy in the determination of the property of target 718. Adjusting a phase difference of scattered beams of radiation 719 and 719' can cause the detected Moiré fringes to move (e.g., FIG. 6). The analysis performed by processor 732 can be based on the image changing over time (e.g., snapshots of two or more states of the detected image). To adjust the phase difference of scattered beams of radiation 719 and 719', diffractive element 708 can be adjusted (e.g., translated perpendicular to beam propagation). Diffractive element 708 can be actuated. Adjusting diffractive element 708 can effectively modulate the phase difference of beams of radiation 713 and 713'. Therefore, the phase difference of scattered beams of radiation 719 and 719' can also be modulated because they are based on beams of radiation 713 and 713', respectively.

In some embodiments, diffractive element 708 can comprise an optical filter comprising a periodic optical property. Adjusting diffractive element 708 can comprise adjusting the periodic optical property. For example, diffractive element 708 can comprise at least one of a piezo-optic device, an electro-optic device, a liquid crystal device, acousto-optic device, and the like, all of which can have an adjustable diffraction optical structure. The type of modulation of the phase difference can be, for example, sinusoidal, linear, sawtooth, triangle, and the like.

To reiterate, in some embodiments, metrology system 700 can adjust a phase difference of scattered beams of radiation 719 and 719' (also "first and second scattered beams"). Adjusting the phase difference of scattered beams of radiation 719 and 719' can comprise at least one of adjusting diffractive element 708, adjusting a position of target 718 (e.g., movement relative to optical system 710), or both adjusting diffractive element 708 and adjusting a position of target 718.

In some embodiments, a signal from one or more detector elements (e.g., pixels) of detector 728 are analyzed by processor 732. For simplicity, the following discussion will focus on one detector element, but it should be appreciated that other detector elements can be used in a similar manner. As the Moiré fringes shift across detector 728, a detector element can detect a varying radiation intensity that is characteristic of the modulated phase difference (e.g., sinusoidal, linear, sawtooth, triangle, and the like). Similar to how a mathematical fit was described previously for a still image, here, the mathematical fit is performed with respect to time for the intensity detected at the detector element. The fit can be iterated for all relevant detector elements. One or more detector elements may be disregarded by processor 732 based on, for example, an algorithm that determines the absence of optical energy or outlier behavior at a detector element. The minimum number of "snapshots" required can be, for example, three for a periodic pattern (e.g., sinusoidal). However, it should be appreciated that higher number and density of data points (e.g., higher sampling rate) can produce more precise mathematical fits. Whether more or fewer data points are used can be determined from, for example, hardware processing constraints. Depending on hardware and computational stresses and costs, fewer or more data points can be used.

In some embodiments, processor 732 can determine a property of target 718 by comparing the information inferred from the mathematical fit to a reference (e.g., information from a fiducial on stage 722). For example, the phase information from target 718 can be compared to the phase information on the fiducial on stage 722. Phase information from fiducial on stage 722 (not shown) can be acquired by performing a measurement on the fiducial that is similar to the measurement on target 718.

In some embodiments, the phase difference of scattered beams of radiation 719 and 719' can be modulated by moving target 718 (e.g., by translating stage 722). However, each detector element on detector 728 will "see" a different portion of target 718 as it is translated, which can render the measurement unusable. To address this issue, in some embodiments, detector 728 can also be translated to match the movement of target 718. In some embodiments, processor 732 can be made cognizant of the translation of target 718 and associated detector elements (e.g., map a pixel to the spot on target 718 for each snapshot as target 718 moves). The image on detector 728 can be correlated to the movement of target 718 based on the magnification of the detection optics.

In some embodiments, movable components can be actuated as a continuous scan or in discrete steps. A combination of both movement types can also be used. Discrete steps for acquisition of each data point can stabilize captured images (e.g., clearer images). However, rapid acceleration and deceleration from the discrete steps can stress the actuating hardware. If continuous motion is used, the hardware stress can be mitigated, but the captured images may have some blurring.

FIG. 8 shows a metrology system 800, according to some embodiments. In some embodiments, metrology system 800 can also represent a more detailed view of metrology system 700 (FIG. 7). Unless otherwise noted, elements of FIG. 8 that have similar reference numbers (e.g., reference numbers sharing the two right-most numeric digits) as elements of FIGS. 4A, 4B, and 7 can have similar structures and functions. For simplicity, such structures and their functions will not be reintroduced.

In some embodiments, metrology system 800 can further comprise a waveform generator 844 and a frequency doubler 846. Waveform generator 844 can generate a signal having a function (e.g., an oscillating signal), which can be used in the adjusting of diffractive element 808. Therefore, the adjusting of diffractive element 808 can be based on the oscillating signal. The signal from waveform generator 844 can be sent to frequency doubler 846. A frequency doubled signal from frequency doubler 846, as a reference signal, can be sent to detector 828. In some embodiments, detector 828 can comprise a lock-in imaging detector (e.g., a lock-in camera).

In some embodiments, lock-in detection can use the principles of lock-in amplifiers to provide sensitive detection and selective filtering of weak or noisy signals and can improve signal-to-noise ratio (SNR). Lock-in amplifier techniques can provide improved accuracy, faster detection times, and reduced noise in an overlay and/or alignment sensor. Further, compact integrated systems, for example, in a single "on chip" detector, can provide a miniaturized detector for measuring a particular characteristic (e.g., alignment) of an alignment mark on a substrate.

In some embodiments, lock-in detection can use what is known as phase-sensitive detection to single out a component of a signal at a specific reference frequency and phase, and can extract the signal from an extremely noisy background. Lock-in detection relies on the orthogonality of sinusoidal functions and can multiply an input signal by a reference signal(s) and integrate the resulting signal over a specified time(s) (e.g., low-pass filter) to extract the desired components (e.g., phase and amplitude).

In some embodiments, lock-in detection can use homodyne detection or heterodyne detection. Homodyne detection uses a single reference frequency (e.g., first frequency $f_1$) to extract the modulated signal. For example, homodyne detection extracts encoded information from an oscillating signal (e.g., phase and/or frequency) by comparing that signal with a standard reference oscillation (e.g., identical to the signal if it carried null information). Heterodyne detection uses two reference frequencies (e.g., first frequency $f_1$ and second frequency $f_2$) to extract the modulated signal. For example, heterodyne detection extracts encoded information from an oscillating signal (e.g., phase and/or frequency) by comparing that signal with a standard reference oscillation (e.g., identical to the signal if it carried null information) as well as comparing that signal with a beat frequency (e.g., difference) between the first and second frequencies (e.g., $f_1$-$f_2$). Further, by mixing two frequencies (e.g., $f_1$ and $f_2$), a higher frequency than a detector response time can be measured (e.g., $f_1$-$f_2$), and flicker noise (e.g., 1/f power spectral density) can be reduced.

In some embodiments, adjusting the phase difference of beams of radiation 813 and 813' can cause twice the amount of change to the phase difference of scattered beams of radiation 819 and 819'. Therefore, detector 828 can receive a reference signal (e.g., from frequency doubler 846) with twice the frequency of the frequency used on diffractive element 808. A portion(s) of detector 828 (e.g., one or more detector elements) contributes to the detection signal a phase and/or frequency of intensity modulation detected at the portion(s) of detector 828. The detected phase of intensity modulation is not to be conflated with phases of illumination wavefronts. Processor 832 can analyze signals from the portion(s) of detector 828 to determine phase(s) and/or frequency of intensity modulation at the portion(s). Processor 832 can determine a property of target 818 by comparing the phase of modulation at each detector element to a reference (e.g., information from a fiducial on stage 822 or substrate 820). A portion of detector 828 (e.g., one or more detector elements) may be disregarded by processor 832 based on, for example, an algorithm that determines the absence of optical energy, outlier behavior, and/or noise at a detector element. Processor 832 can be a processor in the lock-in camera.

In some embodiments, detector 828 can comprise the electronics for performing lock-in techniques for each detector element (e.g., C2 heliCam by Heliotis AG, Lucerne, Switzerland).

In some embodiments, detector 828 can be disposed away from the location where optical element 842 focuses scattered beams of radiation 819 and 819'. In this scenario, a fiber array (not shown) can be disposed at the focal point of optical element 542. The fiber array can guide the radiation representing the image to detector 828.

Figure 9:
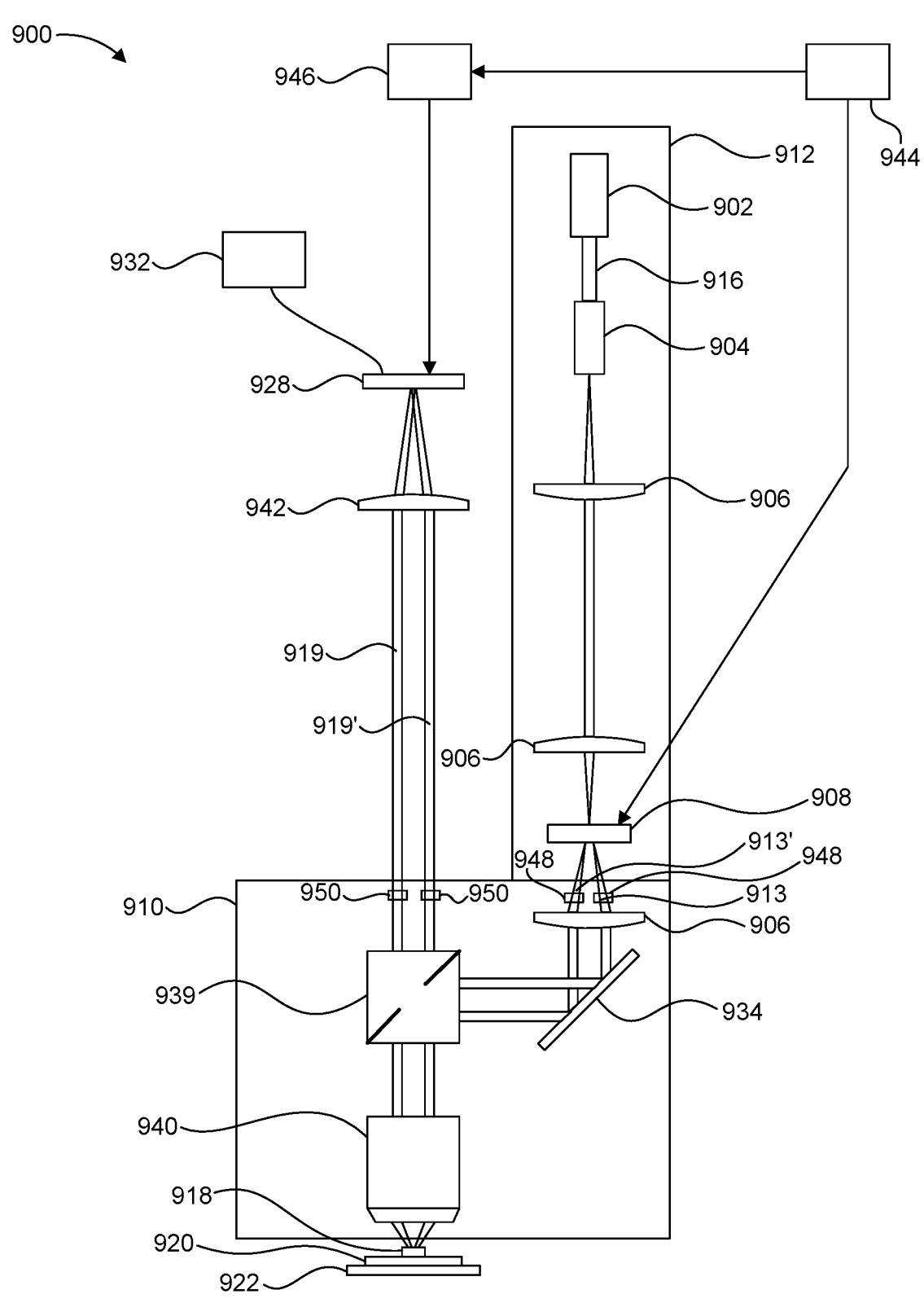

FIG. 9 shows a metrology system 900, according to some embodiments. In some embodiments, metrology system 900 can also represent a more detailed view of metrology system 700 (FIG. 7). Unless otherwise noted, elements of FIG. 9 that have similar reference numbers (e.g., reference numbers sharing the two right-most numeric digits) as elements of FIGS. 4A, 4B, 7, and 8 can have similar structures and functions. For simplicity, such structures and their functions will not be reintroduced.

In some embodiments, metrology system can comprise an optical system 908 (e.g., beam-splitting element). For disambiguation with respect to other optical systems disclosed herein, optical system 908 may be referred to as a "first optical system" and identified further by its functions (e.g., beam splitting). Similarly, second, third, and further optical systems may be defined based on their functions. For example, "second" optical system 910 for directing beams of radiation. In another example, optical element 942 may be referred to as a "third" optical system for interfering scattered beams of radiation 919 and 919' interfere at a detector 928. Optical system 908 can comprise a diffractive element (e.g., diffractive element 808 in FIG. 8). In some embodiments, optical system 908 can comprise a beam splitter, prism, mirror, and the like. In some embodiments, optical system 908 can be a combination of any of beam splitters, prisms, mirrors, and the like. Metrology system may further comprise one or more phase adjusters 948 and one or more phase adjusters 950. Each of one or more phase adjusters 948 and/or 950 can be any of an acousto-optic modulator, an electro-optic modulator, a piezo-optic modulator, a thermo-optic modulator, a variable refractive index device, a variable path length device, and the like. In some embodiments, each of one or more phase adjusters 948 and/or 950 can be a combination of any of acousto-optic modulators, electro-optic modulators, a piezo-optic modulators, a thermo-optic modulators, a variable refractive index device, a variable path length device, and the like.

In some embodiments, optical system 908 can generate beams of radiation 913 and 913' (e.g., via diffraction or beam splitting of radiation 916). Any of beams of radiation 913 and 913' can be transmitted through one or more phase adjusters 948. One or more phase adjusters 948 can be adjusted to change the phase(s) of beams of radiation 913 and/or 913'. In this manner, the phase difference between beams of radiation 913 and 913' is adjusted. And, though two phase adjusters 948 are shown in FIG. 9, it should be appreciated that it is possible to adjust the phase difference with just one phase adjuster 948. The phase(s) of beams of radiation 919 and 919' can be similarly adjusted using one or more phase adjusters 950. It should be appreciated that one or more phase adjusters 950 can adjust the phase difference of radiation after scattering from target 918, whereas one or more phase adjusters 948 can adjust the phase difference of radiation before scattering from target 918.

In some embodiments, by using one or more phase adjusters 948 and/or 950, optical system 908 can remain static, in contrast to FIGS. 7 and 8, where a diffractive element was adjustable to allow adjustment of the phase difference. However, in some embodiments, optical system 908 may be adjustable (e.g., allowed to translate perpendicular to beam direction) in order to adjust the phase difference between beams of radiation 913 and 913').

Figure 10:
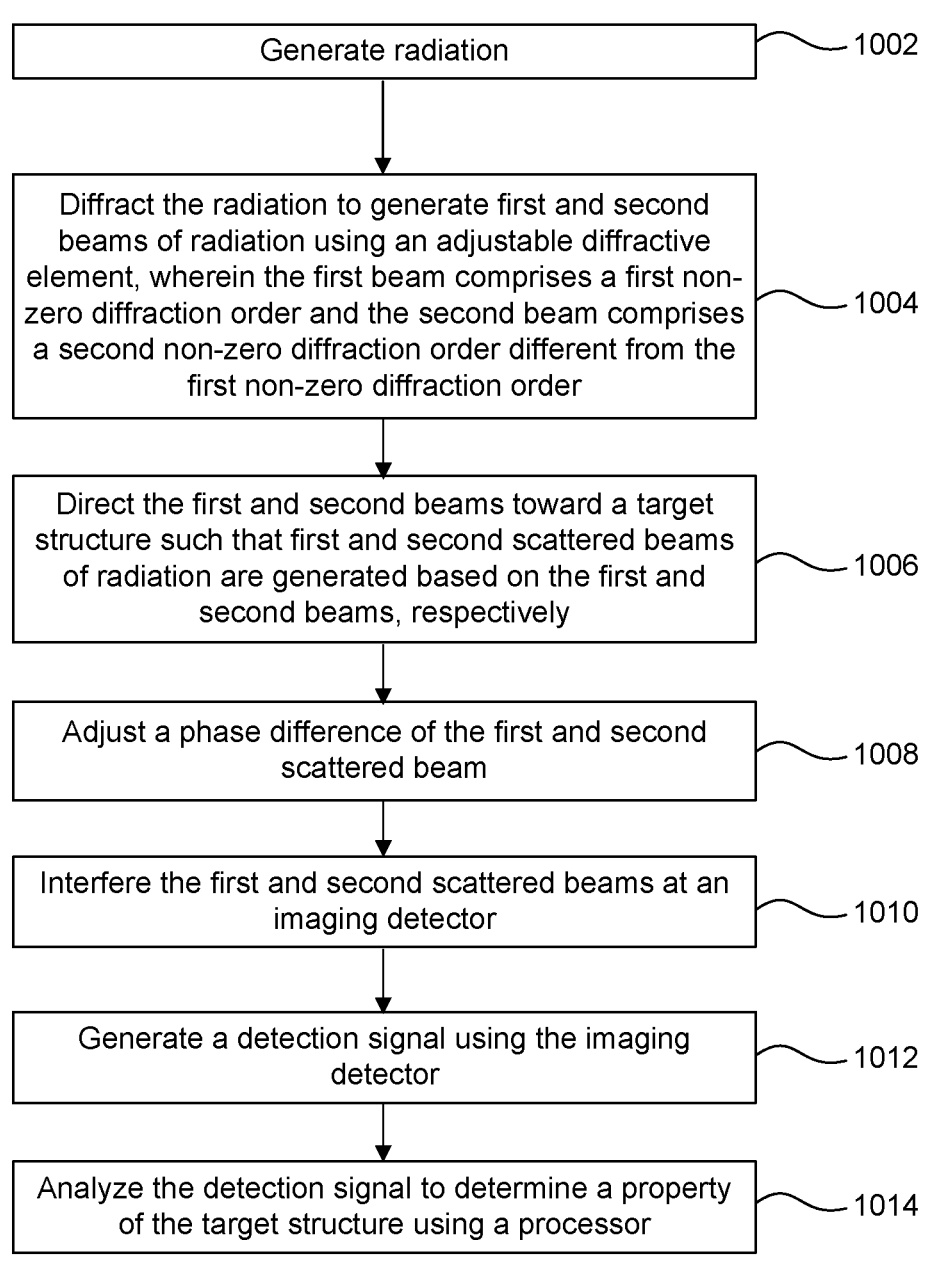
FIG. 10 shows method steps for performing functions of embodiments described herein, according to some embodiments.

FIG. 10 shows method steps for performing functions described herein, according to some embodiments. The method steps of FIG. 10 can be performed in any conceivable order and it is not required that all steps be performed. Moreover, the method steps of FIG. 10 described below merely reflect an example of steps and are not limiting. That is, further method steps and functions may be envisaged based upon embodiments described in reference to FIGS. 1-9.

At step 1002, radiation is generated.

At step 1004, the radiation is diffracted to generate first and second beams of radiation using an adjustable diffractive element. The first beam comprises a first non-zero diffraction order. The second beam comprises a second non-zero diffraction order different from the first non-zero diffraction order.

At step 1006, the first and second beams are directed toward a target structure such that first and second scattered beams of radiation are generated based on the first and second beams, respectively.

At step 1008, a phase difference of the first and second scattered beams is adjusted.

At step 1010, the first and second scattered beams are interfered at an imaging detector.

At step 1012, a detection signal is generated using an imaging detector.

At step 1014, the detection signal is analyzed to determine a property of the target structure based on at least the adjusted phase difference using a processor.

The method steps of FIG. 10 may be performed in any conceivable order and it is not required that all steps be performed. Moreover, the method steps of FIG. 10 described above merely reflect an example of steps and are not limiting. That is, further method steps and functions may be envisaged based upon embodiments described in reference to FIGS. 1-9, as well as FIGS. 11-15 described below.

Figure 11:
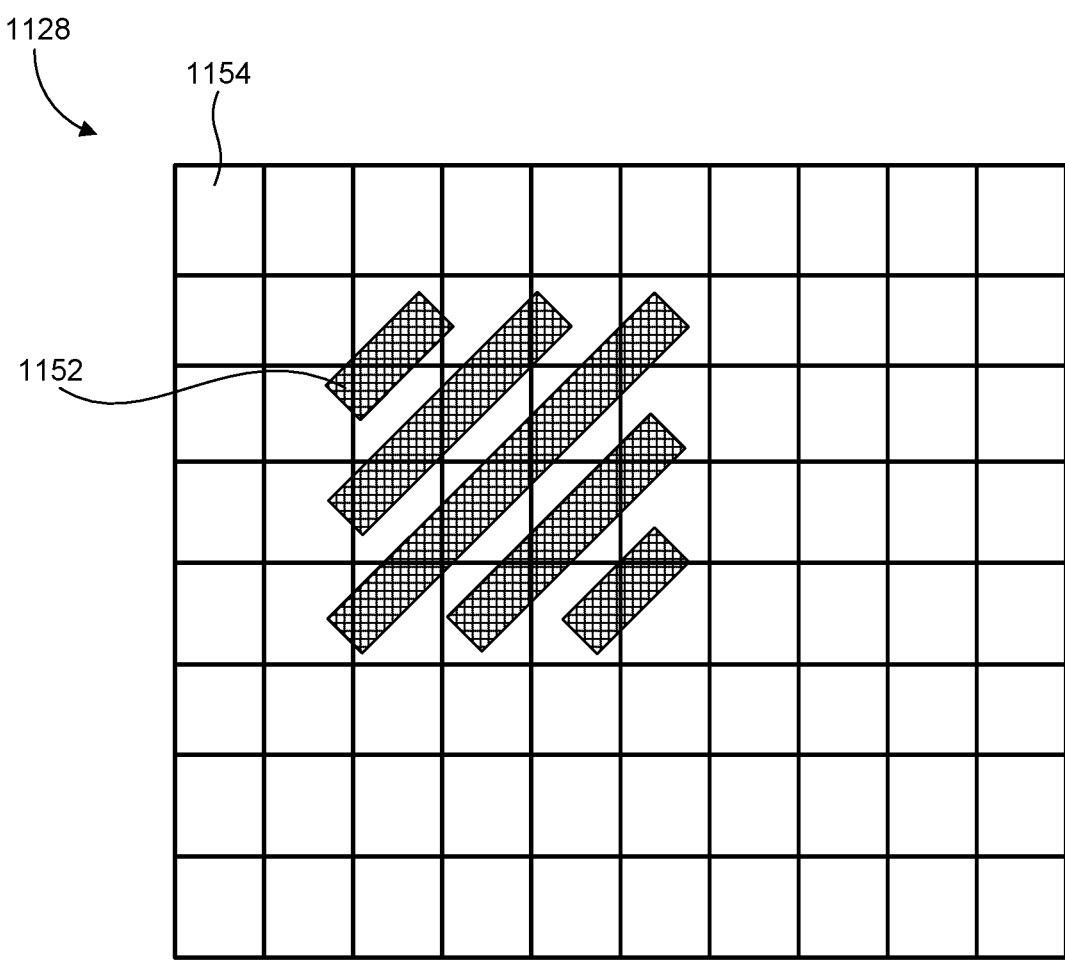
FIG. 11 shows an interference pattern formed on a detector, according to some embodiments.

FIG. 11 shows an interference pattern 1152 formed on a detector 1128, according to some embodiments. In some embodiments, briefly referencing FIG. 9, detector 1128 can be used as detector 928. Interference pattern 1152 can be formed due to optical element 942 interfering scattered beams of radiation 919 and 919' at detector 1128. Detector 1128 can comprise an imaging detector. Detector 1128 can comprise detector elements 1154 (e.g., pixels). It was described earlier that the phase difference of scattered beams of radiation 919 and 919' can be modulated (e.g., modulated sinusoidally over time). Correspondingly, interference pattern 1152 can appear to move across detector elements 1154. When considering only a single detector element 1154, the detected illumination intensity at the single detector element 1154 can increase and/or decrease as the interference pattern 1152 moves.

In some embodiments, interference pattern 1152 can be the result of a superposition of a plurality of wavelengths. That is, detector 1128 can receive the plurality of wavelength, simultaneously, of radiation that has been scattered by a target. Since the phase of each wavelength contribution at detector 1128 is dependent on the wavelength, the intensity variations at each detector element 1154 as interference pattern moves may not have a direct correspondence to the modulation of the phase difference. There can be one or more phase difference values corresponding to one or more wavelengths. However, the phase modulation schemes of a metrology apparatus can be configured such that a modulation of phase differences between two beams of radiation (having multiple wavelengths) can be, for example, proportional with respect to wavelength.

Figure 12:
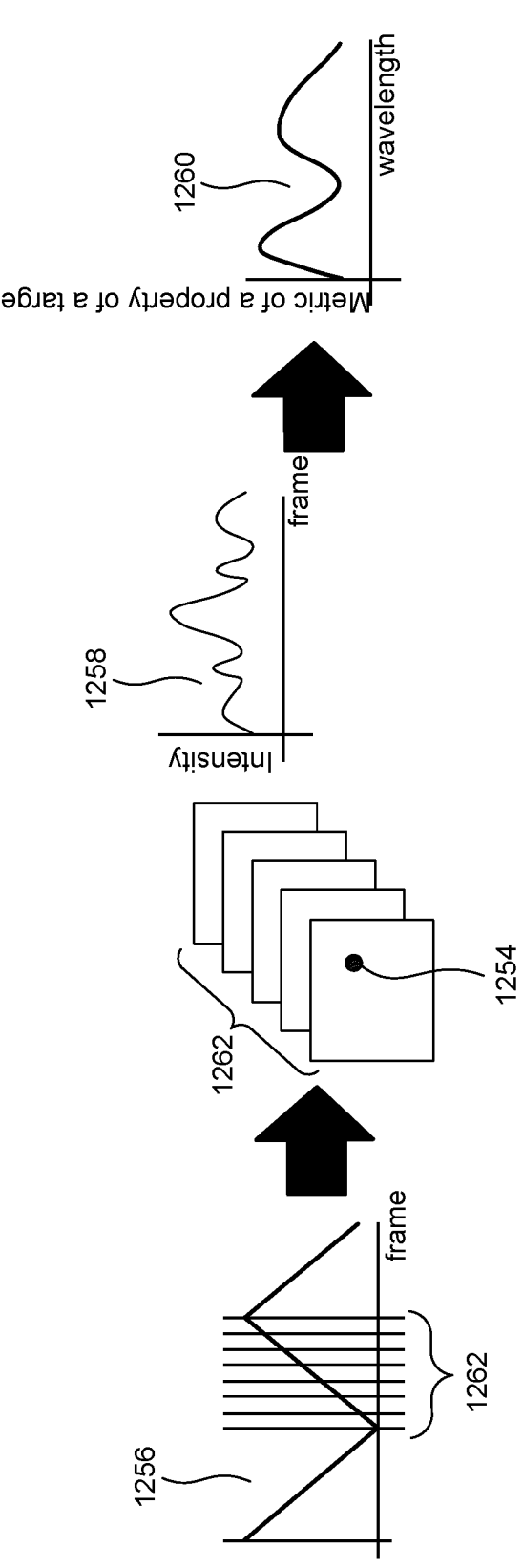
FIG. 12 shows various graphs describing various parameters and effects relating to modulating phase differences of beams of radiation, according to some embodiments.

FIG. 12 shows various graphs 1256, 1258, and 1260 describing various parameters and effects relating to modulating phase differences of beams of radiation (e.g., beams of radiation 919 and 919' (FIG. 9)), according to some embodiments. In graph 1256, the vertical axis represents a value of the modulated phase difference (also "dephasing") between two beams of radiation. The horizontal axis can represent a progression parameter in arbitrary units a.u.—e.g., time, frame slices, amount by which optical system 908 (FIG. 9) is adjusted, frame slices, or the like. The modulation of the dephasing shown in graph 1256 is that of a sawtooth pattern, however, it should be understood that the modulation can be any suitable pattern (e.g., sinusoidal). As the dephasing is modulated, a detector (e.g., 1128 (FIG. 11)) can acquire a sequence of images, denoted by frames 1262. Frames 1262 can comprise a plurality of images. Each image can be divided into portions, with each portion corresponding to pixels 1254 of the detector.

In some embodiments, graph 1258 shows a detected intensity signal at a given pixel. The vertical axis of graph 1258 represents the detected intensity. The horizontal axis represents a progression parameter (e.g., time, frame number, or the like). If the detected signal were to correspond to one wavelength, then the intensity data in graph 1258 would correspondingly display a signal similar to the dephasing in graph 1256 (e.g., a sawtooth, sinusoidal, or other pattern having the same periodicity). However, when multiple wavelengths, and resulting phase deviations, are superimposed on the detector, the evolution of the detection signal associated at the given pixel can be as shown in graph 1258.

In some embodiments, a processor can analyze the detection signal determine a property of the structure based on the phase difference imparted on the detected beams of radiation. For example, the processor can perform frequency analysis on the signal in graph 1258 to extract wavelength information, for example, intensity and modulation phase value of each wavelength contribution. The frequency analysis can comprise a demodulation of the information in the detection signal to frequency domain. For example, the demodulation can comprise a Fourier transform.

In some embodiments, graph 1260 illustrates an example of wavelength decomposition resulting from a frequency analysis of graph 1258. The horizontal axis represents wavelength. The vertical axis represents a metric of a property of a target on which metrology was performed (e.g., target 518). The metric can be, for example, at least a phase of modulation and/or intensity of each wavelength contribution, or a quantity determined therefrom. The phases of modulation can be mapped to corresponding wavelengths. For example, it was previously mentioned that the modulation of the phase differences can be proportional with respect to wavelengths. The proportionality mapping is provided as a non-limiting example, and therefore other suitable mapping schemes can be used. The property of the target can be, for example, an alignment position of the target. The alignment position can be determined based on the metric. The values of the metric can be based on the phase information determined for the given pixel using frequency analysis.

In some embodiments, multiple graphs 1256, 1258, and 1260 can be can be generated, for example, for each of pixels 1254. Then, the determining of the property of the target can be based on the frequency analysis of all of pixels 1254. The combination of information from multiple pixels can enhance accuracy in determining the property of the target.

In some embodiments, errors in the fabrication of the target causes changes to the scattering behavior of each wavelength. Consequently, the data in graphs 1256, 1258, and 1260 can be difficult to reproduce from one fabrication of the target to the next due to fabrication uncertainties. Conversely, an ideal target without uncertainties would result in highly reproducible graphs 1256, 1258, and 1260. Therefore, the method of modulating the phase difference of scattered radiation at multiple wavelengths can be used to discriminate effects of target uncertainties and determine the property of the target to a much higher accuracy than without the use of phase difference modulation.

FIG. 13 shows a phase modulation portion of an illumination system 1312, according to some embodiments. In some embodiments, illumination system 1312 can also represent an alternative or a more detailed view of illumination systems 712 (FIG. 7) and/or 912 (FIG. 9). Unless otherwise noted, elements of FIG. 13 that have similar reference numbers (e.g., reference numbers sharing the two right-most numeric digits) as elements of FIGS. 4A, 4B, 7-9, and 11 can have similar structures and functions. For simplicity, such structures and their functions will not be reintroduced.

In some embodiments, illumination system 1312 comprises an optical system 1308. Optical system 1308 comprises beam splitting elements 1364 and 1364', optical elements 1366 and 1366' (e.g., reflectors), and a phase adjuster 1348. Phase adjuster 1348 (e.g., a piezo device) can be in contact with optical element 1366'. If desired, a second phase adjuster (not shown) can be mechanically coupled to optical element 1366. Beam splitting elements 1364 and 1364' and optical elements 1366 and 1366' can be arranged to split an input beam of radiation 1316 into beams of radiation 1313 and 1313'. Also shown in FIG. 13 is an optical system 1310 for directing beams of radiation 1313 and 1313' onto a target 1318. Optical system 1310 can be external to, or comprised within, illumination system 1312.

In some embodiments, beam of radiation 1316 can interact with beam splitting element 1364' to produce first and second beams. The first beam is directed toward optical element 1366', which is then reflected toward optical system 1310 as beam of radiation 1313'. The second beam continues through to beam splitting element 1364. The second beam is directed toward optical system 1310 as beam of radiation 1313. It should be appreciated that beam splitting element 1364 can be omitted. In this scenario, optical element 1366 can be used instead of beam splitting element 1364 to direct beam of radiation 1313.

The use of beam splitting element 1364 can be helpful, for example, to preserve structural symmetry and/or to direct scattered radiation from target 1318.

In some embodiments, phase adjuster 1348 can be adjusted (e.g., actuated) along direction 1368 to adjust a path length of beam of radiation 1313'. Direction 1368 is parallel to a propagation direction of the first beam reflected from optical element 1366'. Consequently, phase adjuster 1348 can be used to dephase beam of radiation 1313' with respect to beam of radiation 1313—that is, adjust a phase difference of beams of radiation 1313 and 1313'. The phase difference adjustment can be, for example, periodic (e.g., sawtooth or sinusoidal pattern).

FIG. 14 shows a phase modulation portion of an illumination system 1412, according to some embodiments. In some embodiments, illumination system 1412 can also represent an alternative or a more detailed view of illumination systems 712 (FIG. 7), 912 (FIG. 9), and/or 1312 (FIG. 13). Unless otherwise noted, elements of FIG. 14 that have similar reference numbers (e.g., reference numbers sharing the two right-most numeric digits) as elements of FIGS. 4A, 4B, 7-9, 11, and 13 can have similar structures and functions. For simplicity, such structures and their functions will not be reintroduced.

In some embodiments, illumination system 1412 comprises an optical system 1408. Optical system 1408 comprises beam splitting element 1464 and phase adjusters 1448 and 1448' (e.g., actuatable retro-reflectors). Beam splitting element 1464 can split an input beam of radiation 1416 into beams of radiation 1413 and 1413'. Also shown in FIG. 14 is an optical system 1410 for directing beams of radiation 1413 and 1413' onto a target 1418. Optical system 1410 can be external to, or comprised within, illumination system 1412.

In some embodiments, beam of radiation 1416 can interact with beam splitting element 1464 to produce first and second beams. The first beam is directed toward phase adjuster 1448, which is then reflected toward optical system 1410 as beam of radiation 1413. The second beam is directed toward phase adjuster 1448', which is then reflected toward optical system 1410 as beam of radiation 1413'.

In some embodiments, phase adjuster 1448 can be adjusted (e.g., actuated) along direction 1468 to adjust a path length of beam of radiation 1413. Direction 1468 is perpendicular to a propagation direction of the received first beam. By adjusting phase adjuster 1448 along direction 1468, a path length 1470 of the first beam can be adjusted. Consequently, phase adjuster 1448 can be used to dephase beam of radiation 1413' with respect to beam of radiation 1413—that is, adjust a phase difference of beams of radiation 1413 and 1413'. The phase difference adjustment can be, for example, periodic (e.g., sawtooth or sinusoidal pattern). Correspondingly similar functions can be described with respect to phase adjuster 1448', and direction 1468', and beam of radiation 1413'. It should be appreciated that either of phase adjusters 1448 and 1448' can be replaced with a stationary reflector while still achieving the goal of dephasing adjustment between beams of radiation 1413 and 1413'.

FIG. 15 shows a phase modulation portion of an illumination system 1512, according to some embodiments. In some embodiments, illumination system 1512 can also represent an alternative or a more detailed view of illumination systems 712 (FIG. 7), 912 (FIG. 9), 1312 (FIG. 13), and/or 1512 (FIG. 14). Unless otherwise noted, elements of FIG. 15 that have similar reference numbers (e.g., reference numbers sharing the two right-most numeric digits) as elements of FIGS. 4A, 4B, 7-9, 11, 13, and 14 can have similar structures and functions. For simplicity, such structures and their functions will not be reintroduced.

In some embodiments, illumination system 1512 comprises an optical system 1508. Optical system 1508 comprises beam splitting element 1564 and phase adjuster 1548. Phase adjuster 1548 can comprise a plurality of wedge prisms 1572. One or more of wedge prisms 1572 can be adjusted (e.g., actuated). Beam splitting element 1564 can split an input beam of radiation 1516 into beams of radiation 1513 and 1513'. Also shown in FIG. 15 is an optical system 1510 for directing beams of radiation 1513 and 1513' onto a target 1518. Optical system 1510 can be external to, or comprised within, illumination system 1512.

In some embodiments, beam of radiation 1513' can be passed through phase adjuster 1548. Phase adjuster 1548 can be adjusted to adjust a path length of beam of radiation 1513. For example, one or more of actuatable wedge prisms 1572 can be actuated along direction 1568. By adjusting phase adjuster 1548 along direction 1568, a path length of the first beam can be adjusted via adjusting the amount of material traversed by beam of radiation 1513' (e.g., material of higher refractive index). Consequently, phase adjuster 1548 can be used to dephase beam of radiation 1513' with respect to beam of radiation 1513—that is, adjust a phase difference of beams of radiation 1513 and 1513'. The phase difference adjustment can be, for example, periodic (e.g., sawtooth or sinusoidal pattern).

While FIGS. 13-15 describe the use of discrete phase adjusters for modulating phase differences, it should be appreciated that phase adjusting structures described in other figures may be used to modulate phase differences (e.g., diffractive element 708 (FIG. 7)).

Further embodiments are disclosed in the subsequent numbered clauses:

1. A metrology system comprising:
   a radiation source configured to generate radiation;
   an adjustable diffractive element configured to diffract the radiation to generate first and second beams of radiation, wherein the first beam comprises a first non-zero diffraction order and the second beam comprises a second non-zero diffraction order different from the first non-zero diffraction order;
   an optical system configured to direct the first and second beams toward a target structure such that first and second scattered beams of radiation are generated based on the first and second beams, respectively, wherein the metrology system is configured to adjust a phase difference of the first and second scattered beams;
   an optical element configured to interfere the first and second scattered beams at an imaging detector, wherein the imaging detector is configured to generate a detection signal; and
   a processor configured to receive and analyze the detection signal to determine a property of the target structure based on at least the adjusted phase difference.

2. The metrology system according to clause 1, wherein the adjusting the phase difference comprises one of adjusting the adjustable diffractive element, adjusting a position of the target structure relative to the optical system, and adjusting the adjustable diffractive element and the position of the target structure.

3. The metrology system according to clause 2, further comprising a support structure configured to support a substrate comprising the target structure and to perform the adjusting the position of the target structure.

4. The metrology system according to clause 2, wherein:
the adjustable diffractive element comprises a grating; and
the adjusting the adjustable diffractive element comprises translating the grating.

5. The metrology system according to clause 1, wherein:
the adjustable diffractive element comprises an optical filter comprising a periodic optical property; and
the adjusting the adjustable diffractive element comprises adjusting the periodic optical property.

6. The metrology system according to clause 5, wherein the optical filter comprises at least one of acousto-optic device, electro-optic device, piezo-optic device, and liquid crystal device.

7. The metrology system according to clause 1, wherein the property of the target structure comprises an alignment position.

8. The metrology system according to clause 1, further comprising a waveform generator to generate an oscillating signal, wherein the adjusting the diffractive element is based on the oscillating signal.

9. The metrology system according to clause 8, wherein the imaging detector comprises a lock-in camera.

10. The metrology system according to clause 9, wherein the detection signal comprises a phase of intensity modulation at a portion of the lock-in camera.

11. The metrology system according to clause 10, wherein the determining the property of the target structure is based on the phase of intensity modulation at the portion of the lock-in camera.

12. A lithographic apparatus comprising:
an illumination system configured to illuminate a pattern of a patterning device;
a projection system configured to project an image of the pattern onto a substrate; and
metrology system comprising:
a radiation source configured to generate radiation;
an adjustable diffractive element configured to diffract the radiation to generate first and second beams of radiation, wherein the first beam comprises a first non-zero diffraction order and the second beam comprises a second non-zero diffraction order different from the first non-zero diffraction order;
an optical system configured to direct the first and second beams toward a target structure such that first and second scattered beams of radiation are generated based on the first and second beams, respectively, wherein the metrology system is configured to adjust a phase difference of the first and second scattered beams;
an optical element configured to focus and interfere the first and second scattered beams at an imaging detector, wherein the imaging detector is configured to generate a detection signal; and
a processor configured to analyze the detection signal to determine a property of the target structure based on at least the adjusted phase difference.

13. The lithographic apparatus according to clause 12, wherein the adjusting the phase difference comprises one of adjusting the adjustable diffractive element, adjusting a position of the target structure relative to the optical system, and adjusting the adjustable diffractive element and the position of the target structure.

14. The lithographic apparatus according to clause 13, wherein the metrology system further comprises a support structure configured to support the substrate comprising the target structure and to perform the adjusting the position of the target structure.

15. The lithographic apparatus according to clause 13, wherein:
the adjustable diffractive element comprises a grating; and
the adjusting the adjustable diffractive element comprises translating the grating.

16. The lithographic apparatus according to clause 13, wherein the adjustable diffractive element comprises at least one of acousto-optic device, electro-optic device, piezo-optic device, and liquid crystal device.

17. The lithographic apparatus according to clause 13, wherein the property of the target structure comprises an alignment position.

18. The lithographic apparatus according to clause 13, wherein:
the imaging detector comprises a lock-in camera; and
the detection signal comprises a phase of intensity modulation at a portion of the lock-in camera.

19. The lithographic apparatus according to clause 18, wherein the determining the property of the target structure is based on the phase of intensity modulation at the portion of the lock-in camera.

20. A method comprises:
generating radiation;
diffracting the radiation to generate first and second beams of radiation using an adjustable diffractive element, wherein the first beam comprises a first non-zero diffraction order and the second beam comprises a second non-zero diffraction order different from the first non-zero diffraction;
directing the first and second beams toward a target structure such that first and second scattered beams of radiation are generated based on the first and second beams, respectively;
adjusting a phase difference of the first and second scattered beams;
interfering the first and second scattered beams at an imaging detector;
generating a detection signal using the imaging detector; and
analyzing the detection signal to determine a property of the target structure based on at least the adjusted phase difference using a processor.

21. A metrology system comprising:
a radiation source configured to generate radiation;
a beam-splitting element configured to split the radiation to generate first and second beams of radiation and to adjust a phase difference of the first and second beams;
an optical system configured to direct the first and second beams toward a target structure such that first and second scattered beams of radiation are generated based on the first and second beams, respectively, wherein a phase difference of the first and second scattered beams is based on the phase difference of the first and second beams;
an optical element configured to interfere the first and second scattered beams at an imaging detector, wherein the imaging detector is configured to generate a detection signal; and
a processor configured to receive and analyze the detection signal to determine a property of the target structure based on at least the adjusted phase difference.

22. A metrology system comprising:
  a radiation source configured to generate source radiation;
  a beam-splitting element configured to split the source radiation to generate first and second beams of radiation;
  an optical system configured to direct the first and second beams toward a target structure such that first and second scattered beams of radiation are generated based on the first and second beams, respectively;
  a phase adjuster configured to adjust a phase difference of the first and second scattered beams;
  an optical element configured to interfere the first and second scattered beams at an imaging detector, wherein the imaging detector is configured to generate a detection signal; and
  a processor configured to receive and analyze the detection signal to determine a property of the target structure based on at least the adjusted phase difference.

23. The metrology system according to clause 22, wherein the beam-splitting element comprises any one of a beam splitter, a prism, and a mirror.

24. The metrology system according to clause 22, wherein:
  the beam-splitting element comprises a diffractive element configured to diffract the source radiation to generate the first and second beams; and
  the first beam comprises a first non-zero diffraction order and the second beam comprises a second non-zero diffraction order different from the first non-zero diffraction order.

25. The metrology system according to clause 22, wherein the phase adjuster is further configured to adjust a phase of a first one of the first beam, the second beam, the first scattered beam, and the second scattered beam so as to adjust the phase difference.

26. The metrology system according to clause 25, further comprising another phase adjuster configured to adjust a phase of a second one of the first beam, the second beam, the first scattered beam, and the second scattered beam so as to adjust the phase difference.

27. The metrology system according to clause 22, wherein the property of the target structure comprises an alignment position.

28. The metrology system according to clause 22, further comprising a waveform generator to generate an oscillating signal, wherein the adjusting is based on the oscillating signal.

29. The metrology system according to clause 28, wherein the imaging detector comprises a lock-in camera.

30. The metrology system according to clause 29, wherein the detection signal comprises a phase of intensity modulation at a portion of the lock-in camera.

31. The metrology system according to clause 30, wherein the determining the property of the target structure is based on the phase of intensity modulation at the portion of the lock-in camera.

32. A metrology system comprising:
  a radiation source configured to generate radiation;
  a first optical system configured to split the radiation into first and second beams of radiation and impart one or more phase differences between the first and second beams;

a second optical system configured to direct the first and second beams toward a target structure to produce first and second scattered beams of radiation;
  a third optical system configured to interfere the first and second scattered beams at an imaging detector, wherein the imaging detector is configured to generate a detection signal based on the interfered first and second scattered beams, wherein the metrology system is configured to modulate one or more phase differences of the first and second scattered beams based on the imparted one or more phase differences; and
  a processor configured to analyze the detection signal to determine a property of the target structure based on at least the modulated one or more phase differences.

33. The metrology system of clause 32, wherein:
  the radiation source is further configured to generate multiple wavelengths such that each of the first and second scattered beams comprise a plurality of wavelengths; and
  the imaging detector is further configured to receive the plurality of wavelengths, simultaneously, of the interfered first and second scattered beams.

34. The metrology system of clause 33, wherein the processor is further configured to:
  perform a frequency analysis of the detection signal to determine one or more phases of modulation of the plurality of wavelengths received at one or more portions of the imaging detector; and
  determine the property of the target structure based on the frequency analysis.

35. The metrology system of clause 34, wherein:
  the frequency analysis comprises a demodulation of the information in the detection signal to frequency domain; and
  the determining the one or more phases of modulation comprises mapping each of the one or more phases of modulation to corresponding ones of the plurality of wavelengths.

36. The metrology system of clause 35, wherein the demodulation comprises a Fourier transform.

37. The metrology system of clause 33, wherein the processor is further configured to:
  perform the frequency analysis of the detection signal to determine one or more phases of modulation of the plurality of wavelengths received at two or more portions of the imaging detector; and
  determine the property of the target structure based on the frequency analysis.

38. The metrology system of clause 32, wherein the metrology system is further configured to modulate the one or more phase differences of the first and second scattered beams proportionally with respect to wavelength.

39. The metrology system of clause 32, wherein the modulating the one or more phase differences of the first and second scattered beams comprises adjusting the imparted one or more phase differences between the first and second beams using the first optical system and/or adjusting a position of the target structure relative to the second optical system.

40. The metrology system of clause 39, wherein the first optical system comprises an adjustable periodic structure; and the adjusting the imparted one or more phase differences between the first and second beams comprises adjusting the adjustable periodic structure.

41. The metrology system of clause 39, wherein the first optical system comprises:

a beam splitting element configured to perform the splitting;

first and second optical elements configured to direct the first and second beams, respectively; and a phase adjuster mechanically coupled to the first optical element and configured to adjust the first optical element to perform the adjusting the imparted one or more phase differences between the first and second beams.

42. The metrology system of clause 39, wherein the first optical system comprises:

a beam splitting element configured to perform the splitting; and first and second retro-reflectors configured to direct the first and second beams, respectively, wherein at least one of the first and second retro-reflectors is further configured to be adjusted to perform the adjusting the imparted one or more phase differences between the first and second beams.

43. The metrology system of clause 39, wherein the first optical system comprises:

a beam splitting element configured to perform the splitting; and a phase adjuster comprising wedges, wherein at least one of the wedges is configured to be adjusted to perform the adjusting the imparted one or more phase differences between the first and second beams.

44. The metrology system of clause 32, wherein the property of the target structure comprises an alignment position.

45. The metrology system of clause 32, wherein the imaging detector comprises a lock-in camera.

46. The metrology system of clause 45, wherein the detection signal comprises information about the modulated one or more phase differences of the first and second scattered beams at one or more pixels of the lock-in camera.

47. The metrology system of clause 46, wherein:

the processor is configured to analyze the information; and the determining the property of the target structure is further based on the information.

48. A lithographic apparatus comprising:

an illumination system configured to illuminate a pattern of a patterning device;

a projection system configured to project an image of the pattern onto a substrate; and a metrology system comprising:

a radiation source configured to generate radiation;

a first optical system configured to split the radiation into first and second beams of radiation and impart one or more phase differences between the first and second beams;

a second optical system configured to direct the first and second beams toward a target structure to produce first and second scattered beams of radiation;

a third optical system configured to interfere the first and second scattered beams at an imaging detector, wherein the imaging detector is configured to generate a detection signal based on the interfered first and second scattered beams, wherein the metrology system is configured to modulate one or more phase differences of the first and second scattered beams based on the imparted one or more phase differences; and a processor configured to analyze the detection signal to determine a property of the target structure based on at least the modulated one or more phase differences.

49. The lithographic apparatus of clause 48, wherein:

the radiation source is further configured to generate multiple wavelengths such that each of the first and second scattered beams comprise a plurality of wavelengths; and the imaging detector is further configured to receive the plurality of wavelengths, simultaneously, of the interfered first and second scattered beams the processor is further configured to:

perform a frequency analysis of the detection signal to determine one or more phases of modulation of the plurality of wavelengths received at one or more portions of the imaging detector; and determine the property of the target structure based on the frequency analysis;

50. The lithographic apparatus of clause 48, wherein the property of the target structure comprises an alignment position.

51. A method comprising:

generating radiation;

splitting the radiation into first and second beams of radiation using a first optical system;

imparting one or more phase differences between the first and second beams using the first optical system;

directing the first and second beams toward a target to produce first and second scattered beams of radiation;

interfering the first and second scattered beams at an imaging detector;

modulating one or more phase differences of the first and second scattered beams;

generating a detection signal using the imaging detector;

analyzing the detection signal to determine a property of the target structure based on at least the modulated one or more phase differences.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam." "light." "illumination," and the like as used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:

1. A metrology system comprising:
a radiation source configured to generate radiation;
a first optical system comprising at least one beam splitter or diffractive optical element and a waveform generator configured to split the radiation into at least first and second beams of radiation;
one or more phase adjusters configured to receive and impart a phase difference between the first and second beams;
a second optical system comprising at least one reflective or transmissive optical element configured to direct the first and second beams toward a target structure in an off-axis, not fully coherent manner to produce first and second scattered beams of radiation;
a third optical system comprising at least one focusing optical element configured to interfere the first and second scattered beams at an imaging detector, wherein the imaging detector is configured to generate a detection signal based on the interfered first and second scattered beams, wherein the metrology system is configured to impart the phase difference before or after the first and second beams interact with the target structure; and
a processor configured to analyze the detection signal to determine a property of the target structure based on at least the phase difference.

2. The metrology system of claim 1, wherein:
the radiation source is further configured to generate multiple wavelengths such that each of the first and second scattered beams comprise a plurality of wavelengths; and the imaging detector is further configured to receive the plurality of wavelengths, simultaneously, of the interfered first and second scattered beams.

3. The metrology system of claim 2, wherein the processor is further configured to:

perform a frequency analysis of the detection signal to determine one or more phases of modulation of the plurality of wavelengths received at one or more portions of the imaging detector; and determine the property of the target structure based on the frequency analysis.

4. The metrology system of claim 3, wherein:

the frequency analysis comprises a demodulation of the information in the detection signal to frequency domain; and the determining the one or more phases of modulation comprises mapping each of the one or more phases of modulation to corresponding ones of the plurality of wavelengths.

5. The metrology system of claim 2, wherein the processor is further configured to:

perform the frequency analysis of the detection signal to determine one or more phases of modulation of the plurality of wavelengths received at two or more portions of the imaging detector; and determine the property of the target structure based on the frequency analysis.

6. The metrology system of claim 1, wherein the metrology system is further configured to modulate the phase difference of the first and second scattered beams proportionally with respect to wavelength.

7. The metrology system of claim 1, wherein the modulating the phase difference of the first and second scattered beams comprises adjusting the imparted phase difference between the first and second beams using the first optical system and/or adjusting a position of the target structure relative to the second optical system.

8. The metrology system of claim 7, wherein the first optical system comprises an adjustable periodic structure; and the adjusting the imparted phase difference between the first and second beams comprises adjusting the adjustable periodic structure.

9. The metrology system of claim 7, wherein the first optical system comprises:

a beam splitting element configured to perform the splitting;

first and second optical elements configured to direct the first and second beams, respectively; and the one or more phase adjusters are coupled to the first optical element.

10. The metrology system of claim 7, wherein the first optical system comprises:

a beam splitting element configured to perform the splitting; and first and second retro-reflectors configured to direct the first and second beams, respectively, wherein at least one of the first and second retro-reflectors is further configured to be adjusted to perform the adjusting the imparted phase difference between the first and second beams.

11. The metrology system of claim 7, wherein the first optical system comprises:

a beam splitting element configured to perform the splitting; and the phase adjuster comprising wedges, wherein at least one of the wedges is configured to be adjusted to perform the adjusting the imparted phase difference between the first and second beams.

12. The metrology system of claim 1, wherein the phase difference is imparted before the first and second beams interact with the target structure.

13. A lithographic apparatus comprising:

an illumination system configured to illuminate a pattern of a patterning device;

a projection system configured to project an image of the pattern onto a substrate; and a metrology system comprising:

a radiation source configured to generate radiation;

a first optical system, comprising at least one reflective, transmissive, or diffractive optical element, and a waveform generator configured to split the radiation into at least first and second beams of radiation;

one or more phase adjusters configured to impart a phase difference between the first and second beams;

a second optical system, comprising at least one reflective or transmissive optical element, configured to direct the first and second beams toward a target structure in an off-axis, not fully coherent, manner to produce first and second scattered beams of radiation;

a third optical system, comprising at least one focusing optical element, configured to interfere the first and second scattered beams at an imaging detector, wherein the imaging detector is configured to generate a detection signal based on the interfered first and second scattered beams, wherein the metrology system is configured to impart the phase difference before or after the first and second beams interact with the target structure; and a processor configured to analyze the detection signal to determine a property of the target structure based on at least the phase difference.

14. The lithographic apparatus of claim 13, wherein:

the radiation source is further configured to generate multiple wavelengths such that each of the first and second scattered beams comprise a plurality of wavelengths; and the imaging detector is further configured to receive the plurality of wavelengths, simultaneously, of the interfered first and second scattered beams the processor is further configured to:

perform a frequency analysis of the detection signal to determine one or more phases of modulation of the plurality of wavelengths received at one or more portions of the imaging detector; and determine the property of the target structure based on the frequency analysis.

15. The lithographic apparatus of claim 13, wherein the property of the target structure comprises an alignment position.

16. The lithography apparatus of claim 13, wherein the phase difference is imparted before the first and second beams interact with the target structure.

17. A method comprising:

generating radiation;

splitting the radiation into at least first and second beams of radiation using at least one beam splitter or diffractive optical element, and a waveform generator;

imparting a phase difference between the first and second beams using one or more phase adjusters;

directing, using at least one reflective or transmissive optical element, the first and second beams toward a target structure in an off-axis, not fully coherent manner, to produce first and second scattered beams of radiation, wherein the phase difference is imparted before or after the first and second beams interact with the target structure;

interfering, using at least one focusing optical element, the first and second scattered beams at an imaging detector;

modulating one or more phase differences of the first and second scattered beams;

generating a detection signal using the imaging detector; and analyzing the detection signal to determine a property of the target structure based on at least the modulated one or more phase differences.

18. The method of claim 17, wherein the phase difference is imparted before the first and second beams interact with the target structure.

* * * * *